US011145506B2

United States Patent
Maes et al.

(10) Patent No.: US 11,145,506 B2
(45) Date of Patent: Oct. 12, 2021

(54) SELECTIVE PASSIVATION AND SELECTIVE DEPOSITION

(71) Applicant: ASM IP Holding B.V., Almere (NL)

(72) Inventors: Jan Willem Hub Maes, Wilrijk (BE); Michael Eugene Givens, Helsinki (FI); Suvi P. Haukka, Helsinki (FI); VamsI Paruchuri, Mesa, AZ (US); Ivo Johannes Raaijmakers, Bilthoven (NL); Shaoren Deng, Ghent (BE); Andrea Illiberi, Leuven (BE); Eva E. Tois, Espoo (FI); Delphine Longrie, Ghent (BE)

(73) Assignee: ASM IP HOLDING B.V., Almere (NL)

(*) Notice: Subject to any disclaimer, the term of this patent is extended or adjusted under 35 U.S.C. 154(b) by 53 days.

(21) Appl. No.: 16/588,600

(22) Filed: Sep. 30, 2019

(65) Prior Publication Data

US 2020/0105515 A1    Apr. 2, 2020

Related U.S. Application Data

(60) Provisional application No. 62/805,471, filed on Feb. 14, 2019, provisional application No. 62/740,124, filed on Oct. 2, 2018.

(51) Int. Cl.
*H01L 21/02* (2006.01)
*H01L 21/324* (2006.01)
*H01L 21/67* (2006.01)

(52) U.S. Cl.
CPC .... *H01L 21/0228* (2013.01); *H01L 21/02068* (2013.01); *H01L 21/02118* (2013.01);
(Continued)

(58) Field of Classification Search
CPC combination set(s) only.
See application file for complete search history.

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Aaltonen et al., "Atomic Layer Deposition of Iridium Thin Films", Journal of the Electrochemical Society, 151 (8) G489-G492 (2004).

(Continued)

*Primary Examiner* — Ratisha Mehta
(74) *Attorney, Agent, or Firm* — Knobbe, Martens, Olson & Bear LLP

(57) ABSTRACT

Methods for selective deposition are provided. Material is selectively deposited on a first surface of a substrate relative to a second surface of a different material composition. An inhibitor, such as a polyimide layer, is selectively formed from vapor phase reactants on the first surface relative to the second surface. A layer of interest is selectively deposited from vapor phase reactants on the second surface relative to the first surface. The first surface can be metallic while the second surface is dielectric. Accordingly, material, such as a dielectric transition metal oxides and nitrides, can be selectively deposited on metallic surfaces relative dielectric surfaces using techniques described herein.

23 Claims, 19 Drawing Sheets

(52) U.S. Cl.
CPC .. *H01L 21/02178* (2013.01); *H01L 21/02315* (2013.01); *H01L 21/02669* (2013.01); *H01L 21/324* (2013.01); *H01L 21/67213* (2013.01)

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,173,554 B2 | 5/2012 | Lee et al. |
| 8,293,597 B2 | 10/2012 | Raaijmakers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,349,687 B1 | 5/2016 | Gates et al. |
| 9,353,139 B2 | 5/2016 | Sundermeyer et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,204,782 B2 | 2/2019 | Maes et al. |
| 10,343,186 B2 | 7/2019 | Pore et al. |
| 10,373,820 B2 | 8/2019 | Tois et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,480,064 B2 | 11/2019 | Longrie et al. |
| 10,546,741 B2 | 1/2020 | Muramaki et al. |
| 10,695,794 B2 | 6/2020 | Pore et al. |
| 10,847,363 B2 | 11/2020 | Tapily |
| 10,900,120 B2 | 1/2021 | Sharma et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1* | 6/2006 | Parekh ............ H01L 21/823468 438/275 |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |

(56) References Cited

U.S. PATENT DOCUMENTS

| | | |
|---|---|---|
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1* | 6/2013 | Vaidya ................ H01L 31/18 438/98 |
| 2013/0189790 A1 | 7/2013 | Li et al. |
| 2013/0189837 A1 | 7/2013 | Haukka et al. |
| 2013/0196502 A1* | 8/2013 | Haukka ................ C23C 16/04 438/653 |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1* | 1/2015 | Mizue ................ C23C 16/403 427/255.34 |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1* | 8/2015 | Haukka ................ C23C 18/06 427/343 |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1* | 12/2015 | Kimura ................ C08K 7/14 257/98 |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1* | 6/2016 | Bristol ............ H01L 21/31058 257/635 |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |

(56) References Cited

U.S. PATENT DOCUMENTS

| | | |
|---|---|---|
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0105515 A1 | 4/2020 | Maes et al. |

FOREIGN PATENT DOCUMENTS

| | | |
|---|---|---|
| EP | 1340269 | 2/2009 |
| EP | 3026055 | 6/2016 |
| JP | 2001127068 | 5/2001 |
| JP | 2008311603 | 12/2008 |
| JP | 2011018742 | 1/2011 |
| JP | 2011-187583 | 9/2011 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Benzotriazole, Wikipedia via https://en.wikipedia.org/wiki/Benzotriazole; pp. 1-5, no date available.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. Of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Cho et al., "Atomic layer deposition of $AL_2O_3$ thin films using dimethylaluminum isopropoxide and water", Journal of Vacuum Science & Technology A 21, (2003), doi: 10.1116/1.1562184, pp. 1366-1370.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly(methyl methacrylate) Films as Mask Layers, J. Phys. Chem. C, 2008, 112, pp. 15791-15795. (Year: 2008).

Farm et al., "Self-Assembled Octadecyltrimethoxysilane Monolayers Enabling Selective-Area Atomic Layer Deposition of Iridium", Chem. Vap. Deposition, 2006, 12, pp. 415-417.

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 16/399,328, filed Apr. 30, 2019.
File History of U.S. Appl. No. 15/971,601, filed May 4, 2018.
File History of U.S. Appl. No. 16/836,151, filed Mar. 31, 2020.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.

Formic Acid, Wikipedia via https://en.wikipedia.org/wiki/Formic_acid; pp. 1-5, no date available.

George, Steven M., "Atomic Layer Deposition: An Overview", Chem. Rev. 2010, 110, pp. 111-113.

(56) References Cited

OTHER PUBLICATIONS

Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layer Deposition Using Self-Assembled Monolayer and Scanning Probe Lithography, Journal of the Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic and Inorganic-Organic Thin Film Structures by Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 1A323:C3286-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

(56) References Cited

OTHER PUBLICATIONS

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.
Hu et al. "Coating strategies for atomic layer deposition", Nanotechnol. Rev. 2017; 6(6): pp. 527-547.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.
Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

\* cited by examiner

| DIELECTRIC | PASSIVATION BLOCK |
|---|---|
|  | METALLIC |

FIG.2A

| PASSIVATION | PASSIVATION BLOCK |
|---|---|
| DIELECTRIC | METALLIC |

FIG.2B

| PASSIVATION |  |
|---|---|
| DIELECTRIC | METALLIC |

FIG.2C

| PASSIVATION | X |
|---|---|
| DIELECTRIC | METALLIC |

FIG.2D

|  | X |
|---|---|
| DIELECTRIC | METALLIC |

FIG.2E

| | Y |
|---|---|
| PASSIVATION | X |
| DIELECTRIC | METALLIC |

FIG.3A

| | Y |
|---|---|
| | X |
| DIELECTRIC | METALLIC |

FIG.3B

SELECTIVE PASSIVATION AND SELECTIVE DEPOSITION

INCORPORATION BY REFERENCE TO ANY PRIORITY APPLICATIONS

This application claims benefit to U.S. Provisional Patent Application Ser. No. 62/805,471 entitled "Selective Passivation and Selective Deposition," filed on Feb. 14, 2019 and U.S. Provisional Patent Application Ser. No. 62/740,124 entitled "Selective Passivation and Selective Deposition," filed on Oct. 2, 2018, the contents of each of which are hereby incorporated by reference in their entireties.

BACKGROUND

Field

The present disclosure relates generally to selective deposition of materials on a first surface of a substrate relative to a second surface of a different material composition.

Description of the Related Art

The shrinking device dimensions in semiconductor manufacturing call for new innovative processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

Patterning could be simplified by selective deposition, which has gained increasing interest among semiconductor manufacturers. Selective deposition would be highly beneficial in various ways. Significantly, it could allow a decrease in lithography steps, reducing the cost of processing. Selective deposition could also enable enhanced scaling in narrow structures, such as by making bottom up fill possible. Electrochemical deposition is one form of selective deposition, as metals can be formed selectively on conductive elements. Chemical vapor deposition (CVD) and atomic layer deposition (ALD) are surface-sensitive techniques vapor deposition techniques and therefore have been investigated as good candidates for selective deposition. Selective ALD was suggested, for example, in U.S. Pat. No. 6,391,785.

One of the challenges with selective deposition is selectivity for deposition processes are often not high enough to accomplish the goals of selectivity. Surface pretreatment is sometimes available to either inhibit or encourage deposition on one or both of the surfaces, but often such treatments themselves call for lithography to have the treatments applied or remain only on the surface to be treated.

Accordingly, a need exists for more practical processes for accomplishing selective deposition.

SUMMARY OF INVENTION

In one aspect a method is provided for selective deposition on a second surface of a substrate relative to a first surface of the substrate, where the first and second surfaces have different compositions. The method includes, in order: selectively forming an inhibitor layer from vapor phase reactants on the first surface relative to the second surface; baking the inhibitor layer; and selectively depositing a layer of interest from vapor phase reactants on the second surface relative to the passivation layer.

In some embodiments, the method additionally includes treating the first and second surfaces prior to selectively forming the inhibitor layer. In some embodiments, the method includes wherein treating includes exposing the substrate to a plasma. In some embodiments, treating includes exposing the substrate to a silane, such as an alkylaminosilane. In some embodiments, treating includes exposing the substrate to N-(trimethylsilyl)dimethylamine (TMSDMA) or trimethylchlorosilane. In some embodiment, the method further includes cleaning the second surface to remove any inhibitor after selectively forming the inhibitor layer. In some embodiments, the method includes wherein cleaning comprises treatment with hydrogen plasma. In some embodiments, baking includes heating the substrate to a temperature of from about 300 to 400° C.

In some embodiments, the method further includes cleaning the first and second surfaces after selectively depositing the layer of interest. In some embodiments, cleaning includes treating the surfaces with hydrogen plasma. In some embodiments, the method further includes wherein selectively forming an inhibitor layer includes selectively vapor depositing an organic layer on the first surface. In some embodiments, the organic layer is a polyimide layer.

In some embodiments, the layer of interest is selectively deposited by an atomic layer deposition process. In some embodiments, the first surface comprises a metal or metallic material and the second surface comprises a dielectric material.

In some embodiments, wherein the layer of interest comprises a metal oxide. In some embodiments, the metal oxide comprises zirconium oxide, hafnium oxide, aluminum oxide, titanium oxide, tantalum oxide, yttrium oxide, lanthanum oxide, or other transition metal oxide or mixtures thereof. In some embodiments, the metal oxide comprises a dielectric transition metal oxide. In some embodiments, the metal oxide comprises aluminum oxide. In some embodiments, the aluminum oxide is deposited using an aluminum precursor comprising trimethyl aluminum (TMA), dimethylaluminumchloride, aluminum trichloride ($AlCl_3$), dimethylaluminum isopropoxide (DMAI) or triethyl aluminum (TEA). In some embodiments, the aluminum oxide is deposited using an aluminum precursor comprising a heteroleptic aluminum compound comprising an alkyl group and another ligand, such as a halide, for example Cl. In some embodiments, the aluminum oxide is deposited using an aluminum precursor comprising an aluminum alkyl compound comprising two different alkyl groups as ligands. In some embodiments, the aluminum compound is deposited using an aluminum precursor comprising a metalorganic aluminum compound or an organometallic aluminum compound.

In some embodiments, the layer of interest comprises a metal nitride. In some embodiments, the metal nitride is titanium nitride. In some embodiments, the titanium nitride is deposited by a vapor deposition process from $TiCl_4$ and $NH_3$.

In another aspect, a cluster tool is provided for selective deposition of a layer of interest on a second surface of a substrate relative to a first surface of the substrate, where the first and second surfaces have different compositions. The cluster tool includes: a first module configured for pretreating the substrate; a second module configured for treating the substrate with plasma; a third module configured for vapor deposition of an inhibitor on the first surface of the substrate relative to the second surface of the substrate; and a fourth module configured for vapor deposition of the layer of interest.

In another aspect, a system is provided for selective deposition of a dielectric on a second surface of a substrate relative to a first surface of the substrate. The system includes: a first chamber configured for selective deposition of an organic passivation layer and for partial etch-back of the organic passivation layer; and a second chamber configured for selective deposition of the dielectric on the second surface relative to the first surface of the substrate.

In another aspect, a system is provided for selective deposition of a film of interest on a second surface of a substrate relative to the first surface of the substrate. The system includes: a first chamber configured for pretreating the substrate and for etch processing; a second chamber configured for selective deposition of an organic passivation layer; and a third chamber configured for selective deposition of the film of interest on a second surface of the substrate relative to the first surface of the substrate.

In some embodiments, the third chamber is further configured for a bake process. In some embodiments, the system further includes a fourth chamber configured for a bake process.

BRIEF DESCRIPTION OF THE DRAWINGS

FIG. 2A is a schematic cross section of a portion of a substrate having first and second surfaces of different compositions, with a passivation blocking material formed on the second surface, in accordance with a second embodiment.

FIG. 2B is a schematic cross section of the substrate of FIG. 2A after a selective passivation of the first surface.

FIG. 2C is a schematic cross section of the substrate of FIG. 2B after removal of the passivation blocking material from the second surface.

FIG. 2D is a schematic cross section of the substrate of FIG. 2C after selective deposition on the second surface.

FIG. 2E is a schematic cross section of the substrate of FIG. 2D after removal of the passivation material from the first surface.

FIG. 3A is a schematic cross section of the substrate of FIG. 2D after selective deposition of a further material over the second surface, in accordance with a third embodiment.

FIG. 3B is a schematic cross section of the substrate of FIG. 3A after removal of the passivation material from the first surface.

DETAILED DESCRIPTION OF EMBODIMENTS

Figure 1A:
FIG. 1A is a schematic cross section of a portion of a substrate having first and second surfaces of different compositions, in accordance with a first embodiment.

Methods and apparatus are disclosed for selectively depositing material over a second surface relative to a first surface, where the first and second surfaces have material differences. For example, one of the surfaces can include a metallic material and the other surface can include an inorganic dielectric material. In embodiments described herein, an organic passivation layer is deposited selectively on the first surface relative to the second surface. In some embodiments, the first surface is metallic and the second surface is dielectric; in other embodiments the first surface is dielectric and second surface is metallic. Subsequently, a layer of interest is selectively deposited on the second surface relative to the organic passivation layer. In some embodiments the layer of interest may be an $Al_2O_3$ layer. In some embodiments the layer of interest may be a TiN layer. Further layers can be selectively deposited on the layer of interest, over the second surface, relative to the organic passivation layer.

In one embodiment, the first surface comprises a metallic surface, such as an elemental metal or metal alloy, while the second surface comprises an inorganic dielectric surface, such as low-k material. Examples of low-k material include silicon oxide based materials, including grown or deposited silicon dioxide, doped and/or porous oxides, native oxide on silicon, etc. A polymer passivation layer is selectively deposited on the metallic surface relative to the inorganic dielectric surface. Subsequently, a layer of interest is selectively deposited on the inorganic dielectric surface. The layer of interest may include a metal element. Examples of the layer of interest include dielectrics, such as zirconium oxide (e.g., $ZrO_2$), hafnium oxide (e.g., $HfO_2$), aluminum oxide (e.g. $Al_2O_3$), titanium nitride (e.g., TiN) and titanium oxide (e.g., $TiO_2$). Processes are provided for selectively depositing such materials on silicon-oxide based surfaces relative to polymer surfaces.

In a second embodiment, the first surface comprises an inorganic dielectric surface, such as low-k material, while the second surface comprises a metallic surface, such as an elemental metal or metal alloy. Examples of low-k material include silicon oxide based materials, including grown or deposited silicon dioxide, doped and/or porous oxides, native oxide on silicon, etc. A polymer passivation layer is selectively deposited on the inorganic dielectric surface relative to metallic surface. Prior to depositing the polymer passivation layer, the metallic surface can be provided with a passivation blocking layer, such as a self-assembled monolayer (SAM). The passivation blocking layer facilitates selectivity for the polymer deposition on inorganic dielectric surface, and can be removed thereafter to permit selective deposition of a layer of interest on the metallic surface relative to the polymer passivation layer. The layer of interest may include a metal element. Examples of the layer of interest include metal layers (e.g., see U.S. Pat. No. 8,956,971, issued Feb. 17, 2015 and U.S. Pat. No. 9,112,003, issued Aug. 18, 2015), metal nitride layers (e.g., titanium nitride) and metal oxide layers (e.g., zirconium oxide, hafnium oxide, titanium oxide and aluminum oxide). Processes are provided for selectively depositing such materials on metallic surfaces relative to polymer surfaces.

In a third embodiment, the process of the second embodiment is conducted to provide a layer of interest selectively over a metallic surface relative to a polymer-passivated inorganic dielectric surface. Thereafter, a further layer of interest is selectively deposited over the layer of interest while the polymer remains passivating the inorganic dielectric surface. For example, the layer of interest may comprise a metal layer while the further layer of interest comprises a metal oxide layer (e.g., zirconium oxide, hafnium oxide, titanium oxide). Processes are provided for selectively depositing such materials on metallic surfaces relative to polymer surfaces.

The polymer passivation layer may be removed from the first surface following selective deposition of the layer(s) of interest over the second surface. For example, oxidation processes may selectively remove polymer materials. Conditions are chosen to avoid damage to surrounding materials on the substrate.

Embodiments are also provided for controlling the edge profiles and edge positions for selectively deposited layers relative to other features on the substrate, such as the boundaries between underlying metallic and dielectric surfaces. Accordingly, control is provided over relative positioning of selective layer edges without the need for expensive lithographic patterning. Examples illustrate applications for such control, including examples in which the selective layer overlaps the material on which deposition is minimized; examples in which the selective layer is formed with a gap spacing the layer from the material on which deposition is minimized; and examples in which the edge of the selective layer aligns with the boundary between the two disparate underlying materials.

Substrate Surfaces

According to some aspects of the present disclosure, selective deposition can be used to deposit films of interest on a second surface relative to a first surface. The two surfaces can have different material properties that permit selective formation of an organic material thereon, such as selective deposition of a polymer layer on the first surface relative to the second surface, which in turn permits subsequent selective deposition of a layer of interest on the second surface relative to the organic-passivated first layer.

For example, in embodiments described herein, one of the surfaces can be a conductive (e.g., metal or metallic) surface of a substrate, while the other surface can be a non-conductive (e.g., inorganic dielectric) surface of the substrate. In some embodiments, the non-conductive surface comprises —OH groups, such as a silicon oxide-based surface (e.g., low-k materials, including grown and deposited silicon-oxide materials and native oxide over silicon). In some embodiments the non-conductive surface may additionally comprise —H terminations, such as an HF dipped Si or HF dipped Ge surface. In such embodiments, the surface of interest will be considered to comprise both the —H terminations and the material beneath the —H terminations For any of the examples noted above, the material differences between the two surfaces are such that vapor deposition methods can selectively deposit the organic passivation layer on the first surface relative to the second surface. In some embodiments, cyclical vapor deposition is used, for example, cyclical CVD or atomic layer deposition (ALD) processes are used. In some embodiments, selectivity for the organic passivation layer can be achieved without passivation/blocking agents on the surface to receive less of the organic layer; and/or without catalytic agents on the surface to receive more of the organic layer. For example, in embodiments where the first surface is metallic and the second surface is dielectric, polymers can be selectively deposited directly on metallic surfaces relative to inorganic dielectric surfaces. In other embodiments, where the first surface is dielectric and the second surface is metallic, the second surface is first treated to inhibit polymer deposition thereover. For example, a passivation blocking self-assembled monolayer (SAM) can be first formed over a metallic surface relative, facilitating selective deposition of a polymer passivation layer on a dielectric surface, such as an inorganic dielectric surface, relative to a SAM-covered second metallic surface. After selective deposition of the organic passivation is completed, further selective deposition of materials of interest, such as metal oxide or metal layers, can be conducted on the non-passivated second surface relative to the passivated first surface.

For embodiments in which one surface comprises a metal whereas the other surface does not, unless otherwise indicated, if a surface is referred to as a metal surface herein, it may be a metal surface or a metallic surface. In some embodiments, the metal or metallic surface may comprise metal, metal oxides, and/or mixtures thereof. In some embodiments, the metal or metallic surface may comprise surface oxidation. In some embodiments, the metal or metallic material of the metal or metallic surface is electrically conductive with or without surface oxidation. In some embodiments, metal or a metallic surface comprises one or more transition metals. In some embodiments, the metal or metallic surface comprises one or more of Al, Cu, Co, Ni, W, Nb, Fe, or Mo. In some embodiments, a metallic surface comprises titanium nitride. In some embodiments, the metal or metallic surface comprises one or more noble metals, such as Ru. In some embodiments, the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $MoO_x$, $WO_x$, $WNC_x$, TaN, or TiN.

In some embodiments, a metal or metallic surface comprises cobalt (Co), copper (Cu), tungsten (W) or molybdenum (Mo). In some embodiments, the metal or metallic surface may be any surface that can accept or coordinate with the first or second precursor utilized in a selective deposition process of either the organic passivation layer or the layer of interest, as described herein, depending upon the embodiment.

In some embodiments an organic passivation material, such as a polyimide, is selectively deposited on a metal surface, such as a Co, Cu, W, or Mo surface. In some embodiments, selective deposition of the organic passivation material on the metal surface occurs at a growth rate of about 0.5 Å/cycle to about 20 Å/cycle, about 1 Å/cycle to about 15 Å/cycle, about 1.5 Å/cycle to about 10 Å/cycle, or about 2 Å/cycle to about 8 Å/cycle. In some embodiments the growth rate of the organic passivation material on the metal surface is more than about 0.5 Å/cycle, more than about 1 Å/cycle, more than about 3 Å/cycle, more than about 5 Å/cycle while on the upper end the growth rate in some embodiments is less than about 20 Å/cycle, less than about 15 Å/cycle, less than about 10 Å/cycle or less than about 8 Å/cycle. Selectivity for the metal surface relative to a second surface is maintained at these growth rates in some embodiments.

In some embodiments, an organic passivation material is selectively deposited on a metal oxide surface relative to other surfaces. A metal oxide surface may be, for example a $WO_x$, $TiO_x$, surface. In some embodiments, a metal oxide surface is an oxidized surface of a metallic material. In some embodiments, a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material.

In some embodiments, the second surface may comprise a metal surface including a passivation block layer thereover. That is, in some embodiments, the second surface may comprise a metal surface comprising a material that inhibits deposition of the passivation layer thereover, for example a self-assembled monolayer (SAM).

In some embodiments, an organic passivation material is selectively deposited on a first metal oxide surface, which is an oxidized surface of metallic material, relative to a second dielectric surface In some embodiments, one of the first and second surfaces is a metal or metallic surface of a substrate and the other surface is a dielectric surface of the substrate. The term dielectric is used in the description herein for the sake of simplicity in distinguishing from the other surface, namely the metal or metallic surface. It will be understood by the skilled artisan that not all non-conducting surfaces are dielectric surfaces, and conversely not all metallic surfaces are conducting. For example, the metal or metallic surface may comprise an oxidized metal surface that is electrically non-conducting or has a very high resistivity. Selective deposition processes taught herein can deposit on such non-conductive metallic surfaces with minimal deposition on passivated dielectric surfaces and similarly selective deposition processes can deposit on dielectric surfaces with minimal deposition on passivated non-conductive metallic surfaces.

In some embodiments, the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments the substrate surfaces may be exposed to plasma, radicals, excited species, and/or atomic species prior to or at the beginning of the selective passivation layer deposition process. In some embodiments, the substrate surface may be exposed to hydrogen plasma, radicals, or atomic species prior to or at the beginning of the selective passivation layer deposition process.

In some embodiments a non-plasma pretreatment process is conducted. For example, in some embodiments the substrate surface may be exposed to a silicon reactant, such as N-(trimethylsilyl)dimethylamine (TMSDMA) or trimethylchlorosilane. The reactant may be provided in a single long pulse, or in a sequence of multiple shorter pulses. In some embodiments the reactant is provided in 1 to 25 pulses of from about 1 to about 60 seconds. In between pulses, the reaction chamber may be purged with an inert gas. The purge may be, for example for about 1 to 30 seconds.

In some embodiments the surface is contacted with an alkylaminosilane having the formula $(R^I)_3Si(NR^{II}R^{III})$, wherein $R^I$ is a linear or branched C1-C5 alkyl group or a linear or branched C1-C4 alkyl group, $R^{II}$ is a linear or branched C1-C5 alkyl group, a linear or branched C1-C4 alkyl group, or hydrogen, and $R^I$ is a linear or branched C1-C5 alkyl group or a linear or branched C1-C4 alkyl group.

In some embodiments the surface is contacted with a silane having the general formula $(R^I)_3SiA$, wherein $R^I$ is a linear or branched C1-C5 alkyl group or a linear or branched C1-C4 alkyl group, and A is any ligand which is reactive with the silicon containing surface. That is, the silane bonds to the surface through ligand A, or ligand A forms an bond to the surface but then ligand A may migrate away from the surface and/or silane.

The temperature of the pretreatment process may be, for example, from about 100 to about 300° C. The pressure during the pretreatment process may be, for example, from about $10^{-5}$ to about 760 Torr, or in some embodiments from about 1 to 10 Torr or about 0.1 to about 10 Torr. In some embodiments, a pretreatment or cleaning process may be carried out in situ, that is in the same reaction chamber as a selective deposition process. However in some embodiments a pretreatment or cleaning process may be carried out in a separate reaction chamber. In some embodiments the reaction chamber in which the pretreatment process is carried out is part of a cluster tool, including one or more additional reaction chambers. For example, such a cluster tool may include additional reaction chambers for the deposition of the inhibitor, etching and/or deposition of the film of interest. In some embodiments a cluster tool includes separate modules for pretreatment, inhibitor deposition, plasma cleaning (etch) post-deposition of the inhibitor, deposition of the layer of interest and plasma post-deposition cleaning. In some embodiments the same module can be used for two or more processes. For example, the same module may be used for pretreatment, plasma cleaning after deposition of the inhibitor and after deposition of the layer of interest. In some embodiments a cluster tool comprises a first pretreatment module, a plasma cleaning module, an inhibitor deposition module, and a module for depositing the layer of interest.

Selectivity

The skilled artisan will appreciate that selective deposition can be fully selective or partially selective. A partially selective process can result in fully selective layer by a post-deposition etch that removes all of the deposited material from over surface B without removing all of the deposited material from over surface A. Because a simple etch back process can leave a fully selective structure without the need for expensive masking processes, the selective deposition need not be fully selective in order to obtain the desired benefits.

Selectivity of deposition on surface A relative to surface B can be given as a percentage calculated by [(deposition on surface A)−(deposition on surface B)]/(deposition on the surface A). Deposition can be measured in any of a variety of ways. For example, deposition may be given as the measured thickness of the deposited material, or may be given as the measured amount of material deposited. In embodiments described herein, selective deposition of an organic passivation layer can be conducted on a first surface (A) relative to a second surface (B). Subsequently, a layer of interest is selectively deposited on the second surface (A) relative to the organic passivation layer (B) over the first surface.

In some embodiments, selectivity for the selective deposition of the passivation layer on the first surface (relative to the second surface) and/or selectivity of the layer of interest on the second surface (relative to the passivation layer on the first surface) is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity for the organic passivation layer deposition can change over the duration or thickness of a deposition. Surprisingly, selectivity has been found to increase with the duration of the deposition for the vapor phase polymer layer depositions described herein. In contrast, typical selective deposition based on differential nucleation on different surfaces tends to become less selective with greater duration or thickness of a deposition.

In some embodiments, deposition only occurs on the first surface and does not occur on the second surface. In some embodiments, deposition on surface A of the substrate relative to surface B of the substrate is at least about 80% selective, which may be selective enough for some particular applications. In some embodiments, the deposition on the surface A of the substrate relative to surface B of the substrate is at least about 50% selective, which may be selective enough for some particular applications. In some embodiments the deposition on surface A of the substrate relative to the surface B of the substrate is at least about 10% selective, which may be selective enough for some particular applications. The skilled artisan will appreciate that a partially selective process can result in fully selective structure layer by a post-deposition etch that removes all of the deposited material from over surface B without removing all of the deposited material from over surface A. Furthermore, the post-deposition etch can also aid in tailoring the position and/or profile of the selectively deposited layer, as will be better understood from the description of FIGS. 17-23B below.

In some embodiments, the organic layer deposited on the first surface of the substrate may have a thickness less than about 50 nm, less than about 20 nm, less than about 10 nm, less than about 5 nm, less than about 3 nm, less than about 2 nm, or less than about 1 nm, while a ratio of material deposited on the first surface of the substrate relative to the second surface of the substrate may be greater than or equal to about 200:1, greater than or equal to about 100:1, greater than or equal to about 50:1, greater than or equal to about 25:1, greater than or equal to about 20:1, greater than or equal to about 15:1, greater than or equal to about 10:1, greater than or equal to about 5:1, greater than or equal to about 3:1, or greater than or equal to about 2:1.

In some embodiments the selectivity of the selective deposition processes described herein may depend on the material compositions of the materials which define the first and/or second surface of the substrate. For example, in some embodiments where the first surface comprises a BTA passivated Cu surface and the second surface comprises a natural or chemical silicon dioxide surface the selectivity may be greater than about 8:1 or greater than about 15:1. In some embodiments, where the first surface comprises a metal or metal oxide and the second surface comprises a natural or chemical silicon dioxide surface the selectivity may be greater than about 5:1 or greater than about 10:1.

Selective Deposition on Dielectric

FIGS. 1A-1D schematically illustrate a first embodiment for selective passivation of a first surface relative to a second surface, followed by selective deposition on the second surface relative to the passivated first surface. In the illustrated embodiment, the first surface comprises a metallic material; the second surface comprises an inorganic dielectric material; and the material of interest deposited on the second surface comprises a dielectric material.

FIG. 1A illustrates a substrate having materially different surfaces exposed. For example, the first surface can comprise or be defined by a metal, such as cobalt (Co), copper (Cu), tungsten (W) or molybdenum (Mo). The second surface can comprise or be defined by an inorganic dielectric, such as a low-k layer (typically a silicon oxide-based layer) or a silicon surface having native oxide (also a form of silicon oxide) formed thereover.

Figure 1B:
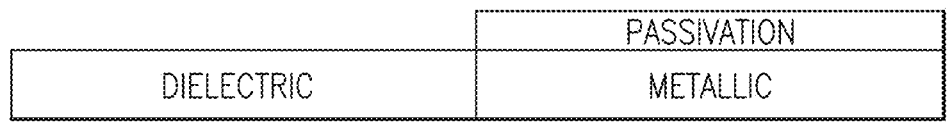
FIG. 1B is a schematic cross section of the substrate of FIG. 1A after a selective passivation of the first surface.

FIG. 1B shows the substrate of FIG. 1A after selective deposition of a passivation layer over the first surface. For example, the passivation layer may be a polymer layer deposited selectively on the metallic surface of the first layer. Methods for selectively depositing polymer layers by vapor deposition techniques are disclosed in U.S. patent application Ser. No. 15/170,769, filed Jun. 1, 2016, the entire disclosure of which is incorporated herein by references for all purposes. Further information and examples of selective deposition of polymer layers to serve as the passivation layer are provided below.

In some embodiments, the selectively deposited polymer is a polyimide. In some embodiments, the polymer deposited is a polyamide. Other examples of deposited polymers include dimers, trimers, polyurea layers, polythiophene polyurethanes, polythioureas, polyesters, polyimines, other polymeric forms or mixtures of the above materials. Vapor deposited organic materials include polyamic acid, which may be a precursor to polymer formation. The selectively deposited layer can be a mixture including polymer and polyamic acid, which for purposes of the present disclosure will be considered to be a polymer.

In some embodiments, selective deposition of the polymer, such as a polyimide, on the first metal-comprising surface, such as a Cu surface, occurs at a growth rate of about 0.5 Å/cycle to about 20 Å/cycle, about 1 Å/cycle to about 15 Å/cycle, about 1.5 Å/cycle to about 10 Å/cycle, or about 2 Å/cycle to about 8 Å/cycle. In some embodiments the growth rate of the polymer, such as a polyimide, on the first metal-comprising surfaces, such as Cu, is more than about 0.5 Å/cycle, more than about 1 Å/cycle, more than about 3 Å/cycle, more than about 5 Å/cycle while on the upper end the growth rate in some embodiments is less than about 20 Å/cycle, less than about 15 Å/cycle, less than about 10 Å/cycle or less than about 8 Å/cycle. Selectivity is maintained at these growth rates in some embodiments.

In some embodiments, selective deposition of a polyimide on Cu surfaces occurs at a growth rate of about 0.5 Å/cycle to about 20 Å/cycle, about 1 Å/cycle to about 15 Å/cycle, about 1.5 Å/cycle to about 10 Å/cycle, or about 2 Å/cycle to about 8 Å/cycle. In some embodiments the growth rate of the polyimide on the Cu surfaces is more than about 0.5 Å/cycle, more than about 1 Å/cycle, more than about 3 Å/cycle, more than about 5 Å/cycle while on the upper end the growth rate in some embodiments is less than about 20 Å/cycle, less than about 15 Å/cycle, less than about 10 Å/cycle or less than about 8 Å/cycle. Selectivity is maintained at these growth rates in some embodiments.

As noted above, any organic material deposited on the second surface (an inorganic dielectric surface in this example) can be removed by an etch back process. In some embodiments, an etch process subsequent to selective deposition of the organic layer may remove deposited organic material from both the first surface and the second surface of the substrate. In some embodiments the etch process may be isotropic.

In some embodiments, the etch process may remove the same amount, or thickness, of material from the first and second surfaces. That is, in some embodiments the etch rate of the organic material deposited on the first surface may be substantially similar to the etch rate of the organic material deposited on the second surface. Due to the selective nature of the deposition processes described herein, the amount of organic material deposited on the second surface of the substrate is substantially less than the amount of material deposited on the first surface of the substrate. Therefore, an etch process may completely remove deposited organic material from the second surface of the substrate while deposited organic material may remain on the first surface of the substrate. Suitable processes for etching polymers are described below with respect to FIG. 1D.

Figure 1C:
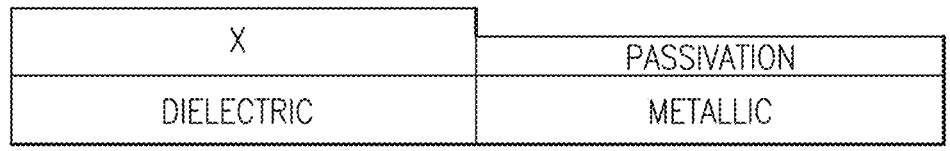
FIG. 1C is a schematic cross section of the substrate of FIG. 1B after selective deposition on the second surface.

FIG. 1C shows the substrate of FIG. 1B following selective deposition of a layer of interest X on the second surface (an inorganic dielectric surface in this example) relative to the passivation layer on the first surface (a metallic surface in this example). The layer of interest X can be a dielectric material, such as a metal oxide such as zirconium oxide, hafnium oxide, aluminum oxide, titanium oxide, tantalum oxide, yttrium oxide, lanthanum oxide, or other transition metal oxide or mixtures thereof. In some embodiments the metal oxide is a dielectric transition metal oxide, or mixture of dielectric transition metal oxides. In some embodiments the layer of interest X can be a metal nitride, such as titanium nitride. Methods for selectively depositing such metal oxide layers by vapor deposition techniques, employing hydrophobic precursors to aid selectivity relative to organic passivation layers, are disclosed in U.S. provisional patent application No. 62/332,396, filed May 5, 2016, the entire disclosure of which is incorporated herein by references for all purposes. Further information and examples of selective deposition of metal oxide and other layers of interest are provided below.

As noted above, any X material deposited on the passivation layer over the first surface can be removed by an etch back process. Because the layer of interest is deposited selectively on the second surface, any X material left on the passivation surface will be thinner than the passivation layer formed on the metallic surface. Accordingly, the etch back process can be controlled to remove all of the X material over the passivation layer without removing all of the layer of interest from over the dielectric surface. Repeatedly depositing selectively and etching back in this manner can result in an increasing thickness of the X material on the dielectric with each cycle of deposition and etch. Repeatedly depositing selectively and etching back in this manner can also result in increased overall selectivity of the X material on the dielectric, as each cycle of deposition and etch leaves a clean passivation layer over which the selective X deposition nucleates poorly. Alternatively, any X material can be removed during subsequent removal of the passivation layer, example conditions for which are described with respect to FIG. 1D below, in a lift-off process. As is known in the art, a lift-off process removes an overlying material by undercutting with removal of an underlying material. Any X material formed on the passivation layer in a short selective deposition process tends to be noncontinuous, allowing access of the etchant to the underlying material to be removed. The lift-off etch need not fully remove the passivation layer in order to remove all of the undesired X material from the passivation layer surface, such that either a direct etch or the lift-off method can be used to remove the X material from the passivation layer surface in a cyclical selective deposition and removal.

Figure 1D:
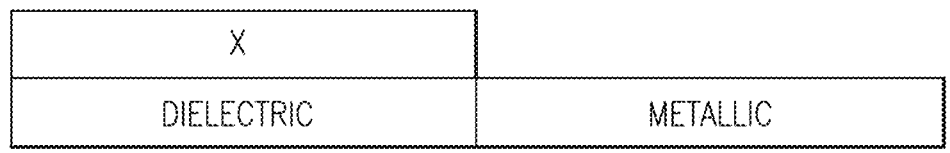
FIG. 1D is a schematic cross section of the substrate of FIG. 1C after removal of the passivation material from the first surface.

FIG. 1D shows the substrate of FIG. 1C after removal of the passivation layer from the first surface. In some embodiments, the etch process may comprise exposing the substrate to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof (see, e.g., Example 2 for selective deposition of passivation layer below). In some embodiments, the plasma may also comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., or between about 100° C. and about 400° C. In some embodiments, the etchant may be supplied in one continuous pulse or may be supplied in multiple shorter pulses. As noted above, the passivation layer removal can be used to lift-off any remaining X material from over the passivation layer, either in a complete removal of the passivation layer or in a partial removal of the passivation layer in a cyclical selective deposition and removal.

As noted above, in some embodiments, $O_3$ (e.g. $O_3/N_2$) can be used in the etch process for removal of the organic passivation layer. In some embodiments, the etch process may be performed at a substrate temperature of about 20° C. to about 500° C. In some embodiments, the etch process may be performed at a substrate temperature of about 50° C. to about 300° C. In some embodiments, the etch process may be performed at a substrate temperature of about 100° C. to about 250° C. In some embodiments, the etch process may be performed at a substrate temperature of about 125° C. to about 200 C. In some embodiments, the etch process may be performed at a rate of about 0.05 nm/min to about 50.0 nm/min. In some embodiments, the etch process may be performed at a rate of about 0.1 nm/min to about 5.0 nm/min. In some embodiments, the etch process may be performed at a rate of about 0.2 nm/min to about 2.5 nm/min. In some embodiments for single wafer or small batch (e.g., 5 wafers or less) processing, a low $O_3$ concentration etch process may be used, wherein the low $O_3$ concentration etch process is performed at 0.01 Torr to 200 Torr, or about 0.1 Torr to 100 Torr (e.g., 2 Torr). Etchant pulsing can be between 0.01 sec and 20 seconds, between 0.05 sec and 10 sec, or between 0.1 sec and 2 seconds (e.g., 0.5 sec pulse/0.5 sec purge of $O_3$). $O_3$ flow can range from 0.01 slm to 1 slm, or from 0.01 slm to 0.250 slm. Inert (e.g., $N_2$) carrier gas flow of can range from 0.1 slm to 20 slm, or from 0.5 slm to 5 slm (e.g., 1.2 slm). In some embodiments, a high $O_3$ concentration etch process may be used, wherein the high $O_3$ concentration etch process is performed at 1-100 Torr, or 5-20 Torr (e.g., 9 Torr), with longer exposures per cycle. For example, $O_3$ exposure times can be between 0.1 sec and 20 s, or between 0.5 sec and 5 seconds (e.g., 1 sec pulse/1 sec purge of $O_3$). $O_3$ flow for such high $O_3$ concentration processes can be between 0.1 slm and 2.0 slm, or between 0.5 slm and 1.5 slm (e.g, 750 sccm), with an inert (e.g., $N_2$) dilution flow of 0.1 slm to 20 slm, or 0.5 slm to 5 slm (e.g., 1.2 slm).

In some embodiments a bake step can be carried out after etching. The bake may be carried out in the same reactor as the deposition of the organic material, the same reactor as the etch process, the same reactor in which a layer of interest is to be subsequently deposited, or may be carried out in a separate reactor from one or more of those aspects of the process. In some embodiments the bake process is carried out in a reaction chamber that is part of a cluster tool and the substrate is moved to one or more different reaction chambers of the cluster tool for additional processing after the bake.

In some embodiments the substrate is baked for a period of about 1 to about 15 minutes. In some embodiments the substrate is baked at a temperature of about 200 to about 500° C. In some embodiments the bake step comprises two or more steps in which the substrate is baked for a first period of time at a first temperature and then baked for a second period of time at a second temperature.

Additional treatments, such as heat or chemical treatment, can be conducted prior to, after or between the foregoing processes. For example, treatments may modify the surfaces or remove portions of the metal, silicon oxide, polymer passivation and metal oxide surfaces exposed at various stages of the process. In some embodiments the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process, however in some embodiments a pretreatment or cleaning process may be carried out in a separate reaction chamber.

Selective Deposition on Metal

FIGS. 2A-2E illustrate schematically illustrate a second embodiment for selective passivation of a first surface relative to a second surface, followed by selective deposition on the second surface relative to the passivated first surface. In the illustrated embodiment, the first surface comprises an inorganic dielectric material; the second surface comprises a metallic surface; and the material of interest deposited on the second surface comprises a dielectric material or a metal.

FIG. 2A illustrates a substrate similar to that of FIG. 1A, having materially different surfaces. For this embodiment, however, the surfaces are described with reversed terminology. In particular, the second surface can comprise or be defined by a metallic material, such as cobalt (Co), copper (Cu), tungsten (W) or molybdenum (Mo). The first surface can comprise an inorganic dielectric, such as a low-k layer (typically a silicon oxide-based layer) or a silicon surface having native oxide (also a form of silicon oxide) formed thereover. A passivation blocking layer is formed over the second surface. Note that the term "blocking" is not meant to imply that the subsequent selective deposition of a passivation layer is completely blocked by the passivation blocking layer. Rather, the passivation blocking layer over the second surface need only inhibit the deposition of the passivation layer to have a lower growth rate relative to the growth rate over the first surface.

In one embodiment, the passivation blocking layer comprises a self-assembled monolayer (SAM). A SAM can be selectively formed over the second (metallic) surface without forming on the first (dielectric) surface. Advantageously, sulfur-containing SAM has been found effective to minimize deposition of the passivation layer thereover.

FIG. 2B shows the selective formation of a passivation layer (e.g., organic passivation layer) over the first surface, in this case the inorganic dielectric layer, relative to the passivation blocking layer over the second surface. As noted in the above incorporated patent application Ser. No. 15/170, 769, filed Jun. 1, 2016, vapor deposition processes described therein are capable of depositing polymer on inorganic dielectrics, and can even deposit selectively (i.e., at differential deposition rates) over different types of silicon oxide. In the present embodiment, sulfur-containing SAM inhibits the polymer deposition thereover, such that polymer can selectively form over the first surface, and can serve as a passivation layer against a subsequent deposition.

FIG. 2C shows the substrate of FIG. 2B after removal of the passivation blocking layer from over the second surface. For example, sulfur-containing SAM material can be removed by heat treatment at temperatures lower than those that would remove a polymer layer like polyimide. Accordingly, a passivation layer is left selectively over the first surface, while the second surface is exposed. The structure is similar to that of FIG. 1B except that the first passivated surface is an inorganic dielectric in this embodiment, and the second surface is a metallic surface.

FIG. 2D shows the substrate of FIG. 2C after selective deposition of a layer of interest X on the second surface relative to the passivation layer over the first surface. As noted with respect to the first embodiment, and described in the above-incorporated provisional patent application No. 62/332,396, filed May 5, 2016, metal oxides can be selectively deposited using vapor deposition techniques and hydrophobic precursors to aid selectivity relative to organic passivation layers, on a number of different surfaces. Further information and examples of selective deposition of metal oxide and other layers of interest are provided below.

Alternatively, the layer of interest X is a metal layer. U.S. Pat. No. 8,956,971, issued Feb. 17, 2015 and U.S. Pat. No. 9,112,003, issued Aug. 18, 2015, the entire disclosures of which are incorporated herein by reference for all purposes, teach processes for selective deposition of metallic materials on metallic surfaces, relative to other material surfaces, including organic surfaces.

FIG. 2E shows the substrate of FIG. 2D after removal of the passivation layer from the first surface, leaving a selectively formed dielectric on metal or metal on metal. The passivation layer can be removed as described above with respect to the first embodiment, such as by $O_3$ etching.

FIGS. 3A-3B illustrate a third embodiment for selective passivation of a first surface relative to a second surface, followed by selective deposition on the second surface relative to the passivated first surface. In the illustrated embodiment, the process of FIGS. 2A-2D is first conducted.

FIG. 3A shows the substrate of FIG. 2D after a further selective deposition. In the event the layer of interest X is a metallic material, the further selective deposition can form a dielectric material as a second layer of interest Y over the first layer of interest, selectively relative to the organic passivation layer. As noted above with respect to the first and second embodiments, and described in the above-incorporated provisional patent application No. 62/332,396, filed May 5, 2016, metal oxides can be selectively deposited using vapor deposition techniques and hydrophobic precursors to aid selectivity relative to organic passivation layers, on a number of different surfaces. Further information and examples of selective deposition of metal oxide and other layers of interest are provided below.

FIG. 3B shows the substrate of FIG. 3A after removal of the passivation layer from the first surface, leaving a selectively formed dielectric on metal. The passivation layer can be removed as described above with respect to the first embodiment, such as by $O_3$ etching.

The second and third embodiments, like the first embodiment, can involve additional treatments, such as heat or chemical treatment, conducted prior to, after or between the foregoing processes.

Selective Deposition of Passivation Layer

As disclosed in the incorporated U.S. patent application Ser. No. 15/170,769, filed Jun. 1, 2016, vapor phase deposition techniques can be applied to organic passivation layers and polymers such as polyimide layers, polyamide layers, polyuria layers, polyurethane layers, polythiophene layers, and more. CVD of polymer layers can produce greater thickness control, mechanical flexibility, conformal coverage, and biocompatibility as compared to the application of liquid precursor. Sequential deposition processing of polymers can produce high growth rates in small research scale reactors. Similar to CVD, sequential deposition processes can produce greater thickness control, mechanical flexibility, and conformality. The terms "sequential deposition" and "cyclical deposition" are employed herein to apply to processes in which the substrate is alternately or sequentially exposed to different precursors, regardless of whether the reaction mechanisms resemble ALD, CVD, MLD or hybrids thereof.

Figure 4A:
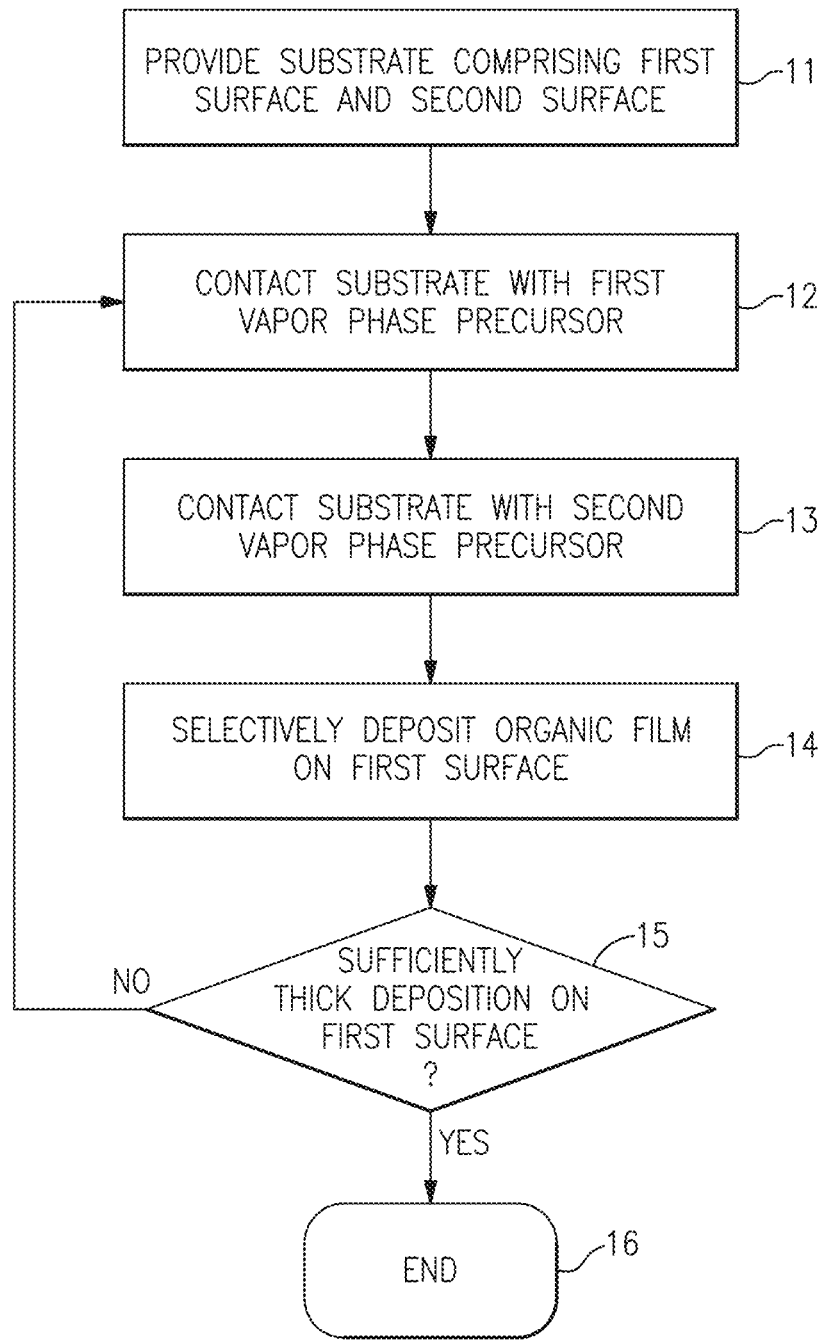
FIG. 4A is a flow diagram generally illustrating processes for selectively depositing an organic passivation layer.

Referring to FIG. 4A and in some embodiments, a substrate comprising a first surface and a second surface is provided at block 11. The first and second surfaces may have different material properties as discussed herein. In some embodiments, the first surface may be a conductive surface, for example a metal or metallic surface, and the second surface may be a dielectric surface (see, e.g., FIGS. 1A-1D). In some embodiments, the first surface may be a dielectric surface and the second surface may be a second, different dielectric surface. In some embodiments, the first surface may be a dielectric surface, for example a silicon oxide-based material, and the second surface may be a passivation blocking material such as an SAM (see, e.g., FIGS. 2A-3B).

In some embodiments, the first precursor may be vaporized at a first temperature to form the first vapor phase precursor. In some embodiments, the first precursor vapor is transported to the substrate through a gas line at a second temperature. In some embodiments, the second transportation temperature is higher than the first vaporization temperature. In some embodiments, the substrate is contacted with a first vapor phase precursor, or reactant, at block 12 for a first exposure period. In some embodiments, the substrate may be contacted with the first vapor phase precursor at a third temperature that is higher than the first temperature.

In some embodiments, the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments, the substrate is contacted with a second vapor phase precursor, or reactant, at block 13 for a second exposure period. In some embodiments, the second precursor may be vaporized at a fourth temperature to form the second vapor phase precursor. In some embodiments, the second reactant vapor is transported to the substrate through a gas line at a second temperature. In some embodiments, the fifth transportation temperature is higher than the first vaporization temperature. In some embodiments, the substrate may be contacted with the second vapor phase precursor at a sixth temperature that is higher than the fourth temperature. In some embodiments, the sixth temperature may be substantially the same as the third temperature at which the first vapor phase precursor contacts the substrate.

In some embodiments, the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

Figure 4B:
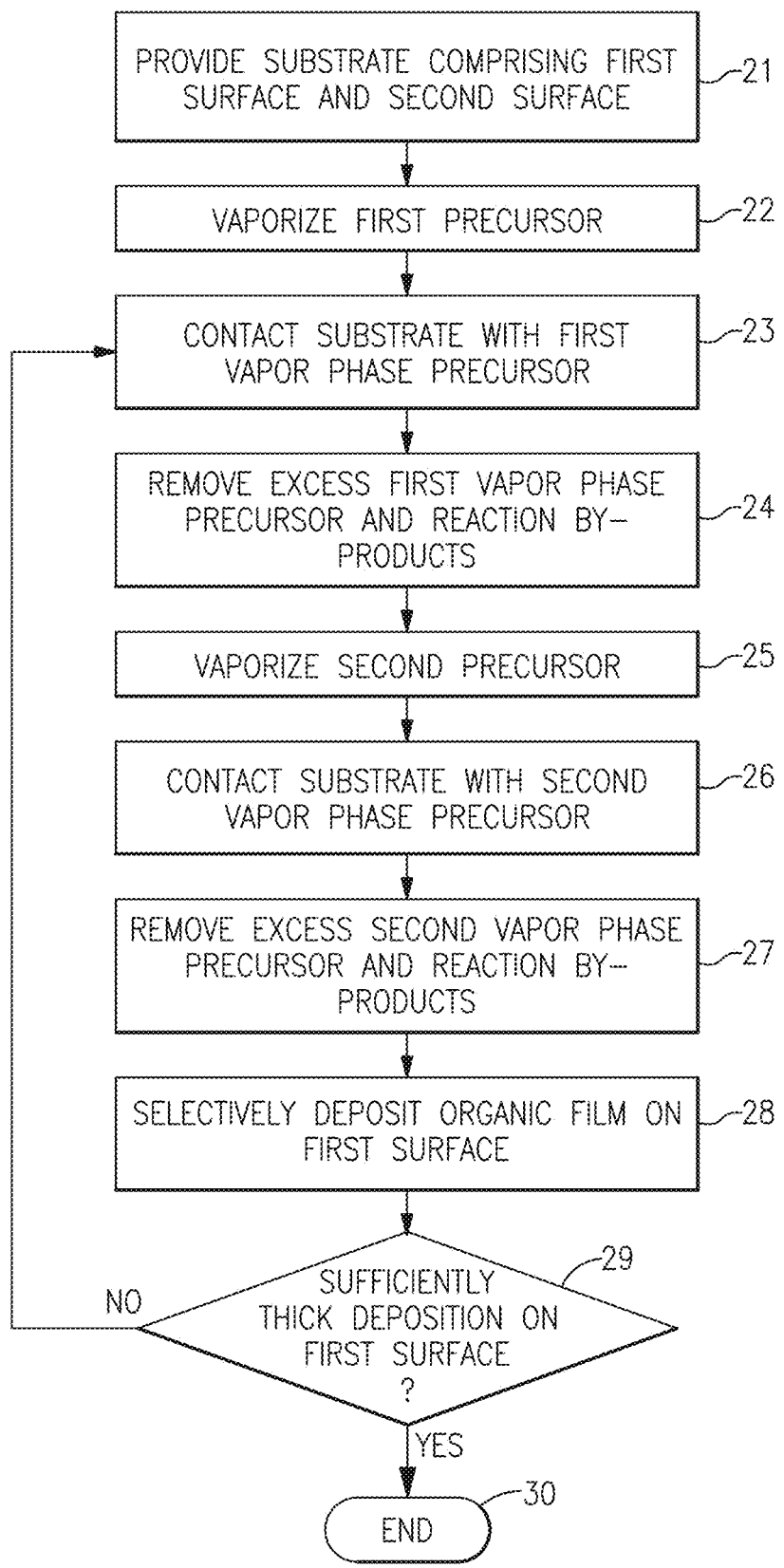
FIG. 4B is a flow diagram generally illustrating atomic layer deposition (ALD) processes for selectively depositing an organic layer.

In block 14 an organic layer is selectively deposited on the first surface relative to the second surface. The skilled artisan will appreciate that selective deposition of an organic layer is the result of the above-described contacting actions, 12-13, rather than a separate action. In some embodiments, the above-described contacting actions, blocks 12-13, may be considered a deposition cycle. Such a selective deposition cycle can be repeated until a layer of sufficient thickness is left on the substrate (block 15) and the deposition is ended (block 16). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal (relative to the substrate) of additional reactants in each cycle or in selected cycles. Though not shown, the process may additionally comprise treating the deposited layer to form a polymer (for example, UV treatment, annealing, etc.). The selectively formed organic layer can serve as a passivation layer to inhibit deposition thereover and increase selectivity in a subsequent selective deposition of a layer of interest, as noted above Referring to FIG. 4B, the vapor deposition process of FIG. 4A may in some embodiments comprise an atomic layer deposition process. A substrate comprising a first surface and a second surface is provided at block 21. The first and second surfaces may have different material properties. In some embodiments, the first surface may be a conductive surface, for example a metal or metallic surface, and the second surface may be a dielectric surface (see, e.g., FIGS. 1A-1D). In some embodiments, the first surface may be a dielectric surface and the second surface may be a second, different dielectric surface. In some embodiments, the first surface may be a dielectric surface, for example a silicon oxide-based material, and the second surface may be a passivation blocking material such as an SAM (see, e.g., FIGS. 2A-3B).

In some embodiments a sequential deposition method for selective vapor deposition of an organic passivation layer comprises vaporizing a first organic precursor is at a first temperature to form a first precursor vapor at block 22. In some embodiments, the first precursor vapor is transported to the substrate through a gas line at a second temperature. In some embodiments the second transportation temperature is higher than the first vaporization temperature. In some embodiments, the substrate is contacted with the vapor phase first precursor for a first exposure period at block 23. In some embodiments, the first precursor, or species thereof, chemically adsorbs on the substrate in a self-saturating or self-limiting fashion. The gas line can be any conduit that transports the first precursor vapor from the source to the substrate. In some embodiments, the substrate may be exposed to the first precursor vapor at a third temperature that is higher than the first temperature.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

Excess of the first precursor vapor (and any volatile reaction by-products) may then be removed from contact with the substrate at block 24. Such removal can be accomplished by, for example, purging, pump down, moving the substrate away from a chamber or zone in which it is exposed to the first reactant, or combinations thereof. In some embodiments, a first precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments, where batch reactors may be used, removal periods of greater than 60 seconds may be employed.

In some embodiments, the second precursor may be vaporized at a fourth temperature to form the second vapor phase precursor at block 25. In some embodiments, the second reactant vapor is transported to the substrate through a gas line at a second temperature. In some embodiments, the fifth transportation temperature is higher than the first vaporization temperature. In some embodiments, the substrate may be contacted with the second vapor phase precursor at a sixth temperature that is higher than the fourth temperature. In some embodiments, the sixth temperature may be substantially the same as the third temperature at which the first vapor phase precursor contacts the substrate. In some embodiments, the substrate may be exposed to a second precursor vapor for a second exposure period at block 26. In some embodiments, the second reactant may react with the adsorbed species of the first reactant on the substrate.

In some embodiments, the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

In some embodiments, excess of the second precursor vapor (and any volatile reaction by-product) is removed from contact with the substrate at block 27, such that the first reactant vapor and the second reactant vapor do not mix. In some embodiments, the vapor deposition process of the organic layer does not employ plasma and/or radicals, and can be considered a thermal vapor deposition process. In some embodiments, a second precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments, where batch reactors may be used, removal periods of greater than 60 seconds may be employed.

In block 28 an organic layer is selectively deposited on the first surface relative to the second surface. The skilled artisan will appreciate that selective deposition of an organic layer is the result of the above-described contacting actions rather than a separate action. In some embodiments, the above-described contacting and removing (and/or halting supply) actions, blocks 23-27, may be considered a deposition cycle. In some embodiments, a deposition cycle may be repeated until an organic layer of a desired thickness is selectively deposited. Such a selective deposition cycle can be repeated (block 29) until a layer of sufficient thickness is left on the substrate and the deposition is ended (block 30). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal of additional reactants in each cycle or in selected cycles. Though not shown, the process may additionally comprise treating the deposited layer to form a polymer (for example, UV treatment, annealing, etc.).

Various reactants can be used for the above described processes. For example, in some embodiments, the first precursor or reactant is an organic reactant such as a diamine, e.g., 1,6-diaminohexane (DAH), or any other monomer with two reactive groups. In some embodiments, the second reactant or precursor is also an organic reactant capable of reacting with adsorbed species of the first reactant under the deposition conditions. For example, the second reactant can be an anhydride, such as furan-2,5-dione (maleic acid anhydride). The anhydride can comprise a dianhydride, e.g., pyromellitic dianhydride (PMDA), or any other monomer with two reactive groups which will react with the first reactant.

In some embodiments the substrate is contacted with the first precursor prior to being contacted with the second precursor. Thus, in some embodiments the substrate is contacted with an amine, such as a diamine, for example 1,6-diaminohexane (DAH) prior to being contacted with another precursor. However, in some embodiments the substrate may be contacted with the second precursor prior to being contacted with the first precursor. Thus, in some embodiments the substrate is contacted with an anhydride, such as furan-2,5-dione (maleic acid anhydride), or a dianhydride, e.g., pyromellitic dianhydride (PMDA) prior to being contacted with another precursor.

In some embodiments, different reactants can be used to tune the layer properties. For example, a polyimide layer could be deposited using 4,4'-oxydianiline or 1,4-diaminobenzene instead of 1,6-diaminohexane to get a more rigid structure with more aromaticity and increased dry etch resistance.

In some embodiments, the reactants do not contain metal atoms. In some embodiments, the reactants do not contain semimetal atoms. In some embodiments, one of the reactants comprises metal or semimetal atoms. In some embodiments, the reactants contain carbon and hydrogen and one or more of the following elements: N, O, S, P or a halide, such as Cl or F. In some embodiments, the first reactant may comprise, for example, adipoyl chloride (AC).

Deposition conditions can differ depending upon the selected reactants and can be optimized upon selection. In some embodiments, the reaction temperature can be selected from the range of about 80° C. to about 250° C. In some embodiments, the reaction chamber pressure may be from about 1 mTorr to about 1000 Torr, from about $10^{-5}$ to about 760 Torr, or in some embodiments from about 1 to 10 Torr. In some embodiments, for example where the selectively deposited organic layer comprises polyamide, the reaction temperature can be selected from a range of about 80° C. to about 150° C. In some embodiments where the selectively deposited organic layer comprises polyamide, the reaction temperature may be greater than about 80° C., 90° C., 100° C., 110° C., 120° C., 130° C., 140° C., or 150° C. In some embodiments where the selectively deposited organic layer comprises polyimide, the reaction temperature may be greater than about 160° C., 180° C., 190° C., 200° C., or 210° C.

For example, for sequential deposition of polyimide using PMDA and DAH in a single wafer deposition tool, substrate temperatures can be selected from the range of about 150° C. to about 250° C., or from about 170° C. to about 210° C., and pressures can be selected from the range of about 1 mTorr to about 760 Torr, or between about 100 mTorr to about 100 Torr.

In some embodiments reactants for use in the selective deposition processes described herein may have the general formula:

$$R^1(NH_2)_2 \qquad (1)$$

wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments, the bonds between carbon atoms in the reactant or precursor may be single bonds, double bonds, triple bonds, or some combination thereof. Thus, in some embodiments a reactant may comprise two amino groups. In some embodiments, the amino groups of a reactant may occupy one or both terminal positions on an aliphatic carbon chain. However, in some embodiments the amino groups of a reactant may not occupy either terminal position on an aliphatic carbon chain. In some embodiments, a reactant may comprise a diamine. In some embodiments, a reactant may comprise an organic precursor selected from the group of 1,2-diaminoethane (1), 1,3-diaminopropane (1), 1,4-diaminobutane(1), 1,5-diaminopentane (1), 1,2-diaminopropane (1), 2,3-butanediamine, 2,2-dimethyl-1,3-propanediamine (1).

In some embodiments, reactants for use in the selective deposition processes described herein may have the general formula:

$$R^2(COCl)_2 \qquad (2)$$

wherein $R^2$ may be an aliphatic carbon chain comprising 1-3 carbon atoms, 2-3 carbon atoms, or 3 or fewer carbon atoms. In some embodiments, the bonds between carbon atoms in the reactant or precursor may be single bonds, double bonds, triple bonds, or some combination thereof. In some embodiments, a reactant may comprise a chloride. In some embodiments, a reactant may comprise a diacyl chloride. In some embodiments, a reactant may comprise an organic precursor selected from the group of oxalyl chloride (I), malonyl chloride, and fumaryl chloride.

In some embodiments, a reactant comprises an organic precursor selected from the group of 1,4-diisocyanatobutane or 1,4-diisocyanatobenzene. In some embodiments, a reactant comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene or terephthalaldehyde. In some embodiments, a reactant being vaporized can be also a diamine, such as 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments, a reactant can be a carboxylic acid, for example alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

In some embodiments, a reactant may have a vapor pressure greater than about 0.5 Torr, 0.1 Torr, 0.2 Torr, 0.5 Torr, 1 Torr or greater at a temperature of about 20° C. or room temperature. In some embodiments, a reactant may have a boiling point less than about 400° C., less than 300° C., less than about 250° C., less than about 200° C., less than about 175° C., less than about 150° C., or less than about 100° C.

Selective Deposition of Layers of Interest Relative to Organic Surfaces

As disclosed in the incorporated U.S. provisional patent application No. 62/332,396, filed May 5, 2016, selective deposition of metallic materials and metal oxides, relative to organic materials such as the passivation layers disclosed herein, can be facilitated by employing hydrophobic reactants. After selectively forming a passivation layer on the first surface, in some embodiments a metal oxide is selectively deposited on the second surface by contacting the substrate alternately and sequentially with a first hydrophobic reactant comprising a metal of the metal oxide and a second reactant comprising oxygen. In some embodiments, the second reactant is water or $H_2O_2$. In some embodiments the substrate is contacted sequentially with the first and second reactants, similar to the sequence of FIG. 4A, except that a non-organic layer is selectively deposited on or over the second surface (see, e.g., FIGS. 1A-3B).

The hydrophobic reactant comprises one or more hydrophobic ligands. In some embodiments, the hydrophobic reactant comprises two to four hydrophobic ligands. In the case of hydrophobic reactants comprising a metal with a valence/oxidation state of n, in some embodiments, the hydrophobic precursor comprises n−1 or n−2 hydrophobic ligands.

In some embodiments, at least one hydrophobic ligand comprises only C and H. In some embodiments, at least one hydrophobic ligand comprises C, H and Si or Ge, but no additional elements.

In some embodiments, a hydrocarbon ligand comprises one or more of the following:
C1-C10 hydrocarbon (single, double or triple bonded)
Alkyls
C1-C5 alkyls
Me, Et, Pr, $^i$Pr, Bu, $^t$Bu
Alkenyls
C1-C6 alkenyls
Cyclic hydrocarbons
C3-C8
Cyclopentadienyl
Cycloheptadienyl
Cycloheptatrienyl
Cyclohexyl
Derivatives of those
Aromatic
C6 aromatic ring and derivatives of those In some embodiments, the hydrophobic reactant comprises no hydrophilic ligands. However, in some embodiments the hydrophobic reactant may comprise one or two hydrophilic ligands. In some embodiments, a hydrophilic ligand comprises nitrogen, oxygen and/or a halogen group.

In some embodiments, a hydrophilic ligand is an alkylamine (—$NR_2$, where each R can be alkyl, hydrogen). In some embodiments, the hydrophilic ligand can be —$NMe_2$, —NEtMe, or —$NEt_2$.

In some embodiments, a hydrophilic ligand is an alkoxide, for example —OMe, —OEt, —O$^i$Pr, —O$^t$Bu.

In some embodiments, a hydrophilic ligand comprises a halide, such as a chloride, fluoride or other halide.

In some embodiments, the hydrophobic precursor comprises the formula:
$L_nMX_y$, in which
In some embodiments n is from 1-6;
In some embodiments n is from 1-4 or 3-4.
In some embodiments y is from 0-2;
In some embodiments y is from 0-1.
L is a hydrophobic ligand;
In some embodiments L is Cp or a C1-C4 alkyl ligand.
X is hydrophilic ligand;
In some embodiments X is an alkylamine, alkoxide or halide ligand.
M is metal (including group 13 elements, B, Ga);
In some embodiments M has an oxidation state of +1 up to +VI.
In some embodiments M has an oxidation state of +IV to +V.
In some embodiments M can be a transition metal.
In some embodiments M is Ti, Ta, Nb, W, Mo, Hf, Zr, V, or Cr.
In some embodiments M is Hf, Zr, Ta or Nb.
In some embodiments M is Zr.
In some embodiments M is Co, Fe, Ni, Cu, or Zn.
In some embodiments the metal is not W or Mo.
In some embodiments M can be a rare earth metal.
In some embodiments M is La, Ce, or Y.
In some embodiments M can be a metal from groups of 2-13.
In some embodiments M is Ba, Sr, Mg, Ca, or Sc.
In some embodiments M is not a noble metal.

More generally, in some embodiments, the selective ALD process employs a metal precursor. In some embodiments, the metal of the metal precursor may be selected from the group comprising Al, Ti, Ta, Nb, W, Mo, Hf, Zr, V, Cr, Co, Fe, Ni, Cu, Zn, La, Ce, Y, Ba, Sr, Mg, Ca, or Sc, or mixtures thereof. In some embodiments, the metal may be Al.

In some embodiments, the hydrophobic reactant is Bis (methylcyclopentadienyl) methoxymethyl Zirconium(IV) (($CpMe)_2$—Zr—(OMe)Me).

In some embodiments, the hydrophobic reactant is bis (methylcyclopentadienyl) methoxymethyl Hafnium(IV) (($CpMe)_2$—Hf—(OMe)Me).

In other embodiments, the selective ALD process employs an Al precursor. Examples of Al precursors include trimethyl aluminum (TMA), aluminum trichloride ($AlCl_3$), dimethylaluminum isopropoxide (DMAI) and triethyl aluminum (TEA). In some embodiments the aluminum precursor is a heteroleptic aluminum compound. In some embodiments the heteroleptic aluminum compound comprises an alkyl group and another ligand, such as a halide, for example Cl. In some embodiments the aluminum compound is dimethylaluminumchloride. In some embodiments the aluminum precursor is an alkyl precursor comprising two different alkyl groups as ligands. In some embodiments the aluminum precursor is a metalorganic compound. In some embodiments the aluminum precursor is an organometallic compound.

In some embodiments, the second reactant contributes one or more elements to the material that is selectively deposited. For example, the second reactant can be an oxygen precursor used to deposit a metal oxide or a nitrogen precursor used to deposit a metal nitride.

In some embodiments, the second reactant comprises an oxygen precursor.

In some embodiments, the second reactant comprises $H_2O$.

In some embodiments, the second reactant comprises $O_3$.

In some embodiments, the second reactant comprises $H_2O_2$.

In some embodiments, the second reactant comprises oxygen plasma, ions, radicals, atomic O or excited species of oxygen.

In some embodiments, the second reactant comprises a nitrogen precursor.

In some embodiments, the second reactant comprises $NH_3$.

In some embodiments, the second reactant comprises $N_2H_4$.

In some embodiments, the second reactant comprises nitrogen containing plasma, ions, radicals, atomic N or excited species comprising N. In some embodiments, the nitrogen reactant can comprise a mixture with corresponding hydrogen species.

In some embodiments, other reactants can be utilize that contribute elements other than N or O to the deposited material. These reactants may be used in addition to a N or O second reactant, or may themselves serve as a second reactant. For example, in some embodiments a sulfur reactant may be used to deposit a sulphide, a carbon reactant may be used to deposit carbon or a silicon reactant may be used to deposit a silicide.

In some embodiments, a second (or additional) reactant may be used that aid in depositing a metal or metallic film, such as an elemental metal film. For example, in some embodiments a hydrogen reactant may be used.

Alternatively, as described with respect to FIG. 2D, a metallic conductive film of interest can be selectively deposited on the second surface, a metallic surface, relative to the organic passivation layer. For example, U.S. Pat. No. 8,956,971, issued Feb. 17, 2015 and U.S. Pat. No. 9,112,003, issued Aug. 18, 2015, the entire disclosures of which are incorporated herein by reference for all purposes, teach processes for selective deposition of metallic materials on metallic surfaces relative to non-metallic surfaces, including organic materials. As also noted above with respect to FIG. 3A, a further dielectric layer, a metal oxide material, can be selectively formed over the selectively formed metallic material layer prior to removal of the organic passivation layer.

In some embodiments a thin film comprising a material of interest, such as aluminum oxide (e.g., $Al_2O_3$) or titanium nitride (e.g., TiN) is selectively deposited on one or more first dielectric or low-k surfaces relative to one or more second metal surfaces, such as a copper, cobalt, titanium nitride or tungsten surfaces. An exemplary process is illustrated in FIG. 13.

Figure 13:
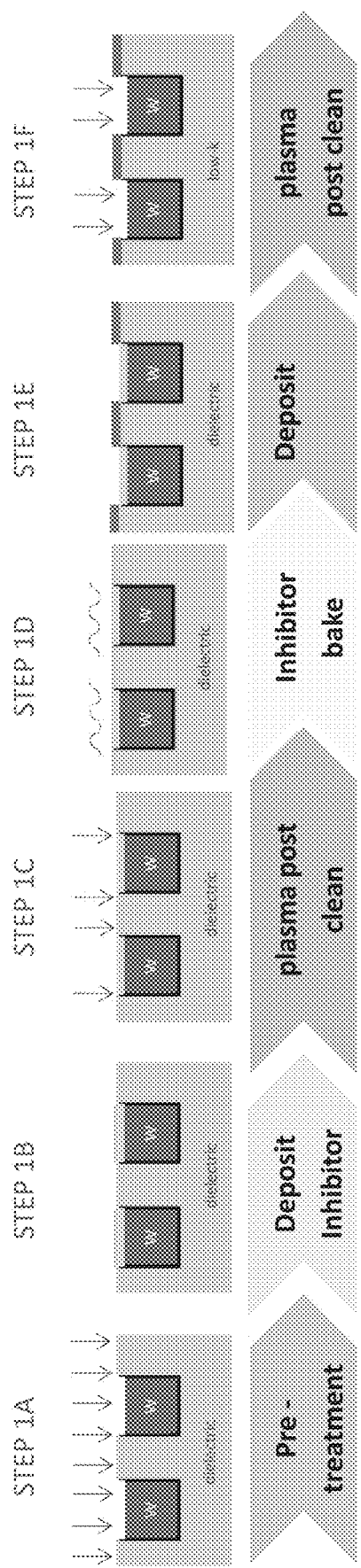
FIG. 13 is a flow diagram illustrating a process flow for selective deposition.

In Step 1A of FIG. 13 a substrate comprising low k surface and metal surfaces is pretreated. As discussed above, in some embodiments pretreatment may comprise exposing the substrate to a plasma, such as hydrogen plasma. In some embodiments a non-plasma pretreatment process is conducted. For example, in some embodiments the substrate surface may be exposed to a silicon reactant, such as N-(trimethylsilyl)dimethylamine (TMSDMA) or trimethylchlorosilane. The reactant may be provided in a single long pulse, or in a sequence of multiple shorter pulses. In some embodiments the reactant is provided in 1 to 25 pulses of from about 1 to about 60 seconds. In between pulses, the reaction chamber may be purged with an inert gas. The purge may be, for example for about 1 to 30 seconds.

In some embodiments the surface is contacted with an alkylaminosilane having the formula $(R^{I})_3Si(NR^{II}R^{III})$, wherein $R^{I}$ is a linear or branched C1-C10 hydrocarbon group or a linear or branched C1-C5 alkyl group or a linear or branched C1-C4 alkyl group, $R^{II}$ is a linear or branched C1-C10 hydrocarbon group or a linear or branched C1-C5 alkyl group, a linear or branched C1-C4 alkyl group, or hydrogen, and $R^{III}$ is a linear or branched C1-C10 hydrocarbon group or a linear or branched C1-C5 alkyl group or a linear or branched C1-C4 alkyl group.

In some embodiments the surface is contacted with a silane having the general formula $(R^{I})_3SiA$, wherein $R^{I}$ is a linear or branched C1-C10 hydrocarbon group or a linear or branched C1-C5 alkyl group or a linear or branched C1-C4 alkyl group, and A is any ligand which is reactive with the silicon containing surface. That is, the silane bonds to the surface through ligand A, or ligand A forms an bond to the surface but then ligand A may migrate away from the surface and/or silane.

The temperature of the pretreatment process may be, for example, from about 100 to about 300° C. The pressure during the pretreatment process may be, for example, from about $10^{-5}$ to about 760 Torr, or in some embodiments from about 1 to 10 Torr or about 0.1 to about 10 Torr. In some embodiments, a pretreatment or cleaning process may be carried out in situ, that is in the same reaction chamber as a selective deposition process.

In Step 1B, an inhibitor, such as an organic material like a polyimide, is selectively deposited on the metal surfaces. The inhibitor may be deposited as described herein. In some embodiments the deposition temperature is about 160 to about 220° C. The reaction chamber pressure may be, for example, from about $10^{-5}$ to about 760 Torr, or in some embodiments from about 1 to 10 Torr or about 1 to 25 Torr. In some embodiments a vapor deposition cycle for depositing a polyimide inhibitor is carried out from about 1 to 1000 times.

In some embodiments a polyimide inhibitor is deposited by alternately and sequentially contacting the substrate with DAH and PDMA. The DAH and PDMA may be alternately and sequentially provided to the reaction space by pulses with a pulse length of about 0.1 to 10s, followed by a purge of about 0.1 to 10s between pulses.

In Step 1C, a cleanup process is carried out to remove any inhibitor that is present on the low-k surfaces. The cleanup process may comprise $H_2$ plasma treatment. The cleanup process may be carried out as described herein. In some embodiments the cleanup process is carried out at a temperature of about room temperature to about 400° C. Plasma power of about 10 to 1000 W or about 25 to 250 W may be used to generate a plasma in flowing $H_2$, for example at a flow rate of about 10 to 500 sccm. The clean time after inhibitor deposition may be, for example, from about 1 to 600 seconds.

In Step 1D a bake is carried out. The bake may, for example, densify the inhibition layer and make it more robust, for example against higher temperature processes that follow. In some embodiments the bake is carried out at a temperature of about 100 to about 800° C., for example about 300 to about 600° C. In some embodiments the bake step is carried out at a temperature greater than 300° C. In some embodiments the bake step is carried out at a temperature of about 400° C. In some embodiments the bake time is about 1 to about 15 minutes. The bake may comprise two steps-a first step at a lower temperature and a second step at a higher temperature. For example, the bake may comprise a first step at a temperature of about 250° C. and a second step at a temperature of about 400° C. In some embodiments the first and second steps are carried out for the same amount of time. In other embodiments they are carried out for different amounts of time.

In some embodiments the bake is carried out in the same reactor as the subsequent selective deposition of the material of interest. In some embodiments the bake is carried out in the same reactor as the deposition of the inhibitor. In some embodiments the bake is carried out in a separate reaction chamber.

In Step 1E a material is selectively deposited on the dielectric surface relative to the metal surfaces comprising the inhibitor by a vapor deposition process. Selective deposition may be as described herein.

In some embodiments aluminum oxide is deposited in Step 1E by alternately contacting the substrate with an aluminum reactant and an oxygen reactant. The aluminum reactant may comprise, trimethyl aluminum (TMA), aluminum trichloride ($AlCl_3$), dimethylaluminum isopropoxide (DMAI) and triethyl aluminum (TEA). In some embodiments the aluminum precursor is a heteroleptic aluminum compound. In some embodiments the heteroleptic aluminum compound comprises an alkyl group and another ligand, such as a halide, for example Cl. In some embodiments the aluminum compound is dimethylaluminumchloride. In some embodiments, the aluminum precursor is an alkyl precursor comprising two different alkyl groups as ligands. In some embodiments, the aluminum precursor is a metalorganic compound. In some embodiments, the aluminum precursor is an organometallic compound. The oxygen reactant may comprise, for example, water or $H_2O_2$. In some embodiments, aluminum oxide may be deposited by an atomic layer deposition process in which the substrate is alternately and sequential contacted with dimethylaluminum isopropoxide (DMAI) and water or $H_2O_2$. In some embodiments, the temperature in the reaction chamber during aluminum oxide deposition is from about 150 to about 350° C. The pulse time for the reactants may be from about 0.1 to about 10 seconds, and the purge time between reactant pulses may also be from about 0.1 to about 10 seconds. The reaction chamber pressure may be, for example, from about $10^{-5}$ to about 760 Torr, or in some embodiments from about 1 to 10 Torr.

In some embodiments titanium nitride is deposited in Step 1E by alternately contacting the substrate with a titanium reactant and a nitrogen reactant. The titanium reactant may comprise, for example, $TiCl_4$. The nitrogen reactant may comprise, for example, $NH_3$. In some embodiments TiN may be deposited by an atomic layer deposition process in which the substrate is alternately and sequential contacted with $TiCl_4$ and $NH_3$. In some embodiments the temperature in the reaction chamber during titanium nitride deposition is from about 250 to about 500° C. The pulse time for the titanium reactant may be from about 0.2 to about 10 seconds, and the pulse time for the nitrogen reactant may be from about 0.1 to about 10 seconds. The purge time between reactant pulses may also be from about 0.1 to about 10 seconds. The reaction chamber pressure may be, for example, from about $10^{-5}$ to about 760 Torr, or in some embodiments from about 1 to 10 Torr. The titanium nitride layer was deposited using the process flow illustrated in FIG. 13.

In Step 1F the substrate is subjected to a post-deposition cleaning step to remove the inhibitor from the metal surfaces, such as treatment with $H_2$ plasma. The cleaning step may comprise $H_2$ plasma treatment. The cleaning process may be carried out as described herein. In some embodiments the cleaning step is carried out at a temperature of about room temperature to about 400° C. Plasma power of about 10 to 2000 W, 25 to 1000 W or 25 to 250 W may be used to generate a plasma in flowing $H_2$, for example at a flow rate of about 10 to 500 sccm. The clean time after deposition of the layer of interest may be, for example, from about 1 to 600 seconds.

In some embodiments a thin film comprising a material of interest, such as aluminum oxide (e.g., $Al_2O_3$) or titanium nitride (e.g., TiN) is selectively deposited on a first surface of a three-dimensional structure relative to one or more second surfaces. The three-dimensional structure may comprise, for example, a via or a trench. In some embodiments an inhibitor, such as a polyimide layer, is non-selectively deposited on the three-dimensional structure. The inhibitor is then patterned to expose the region on which selective deposition is desired. For example, anisotropic etching can be used to remove the layer from surfaces on which deposition is desired. Vapor deposition is then carried out to deposit the layer of interest on the areas that are not covered with inhibitor.

Figure 14:
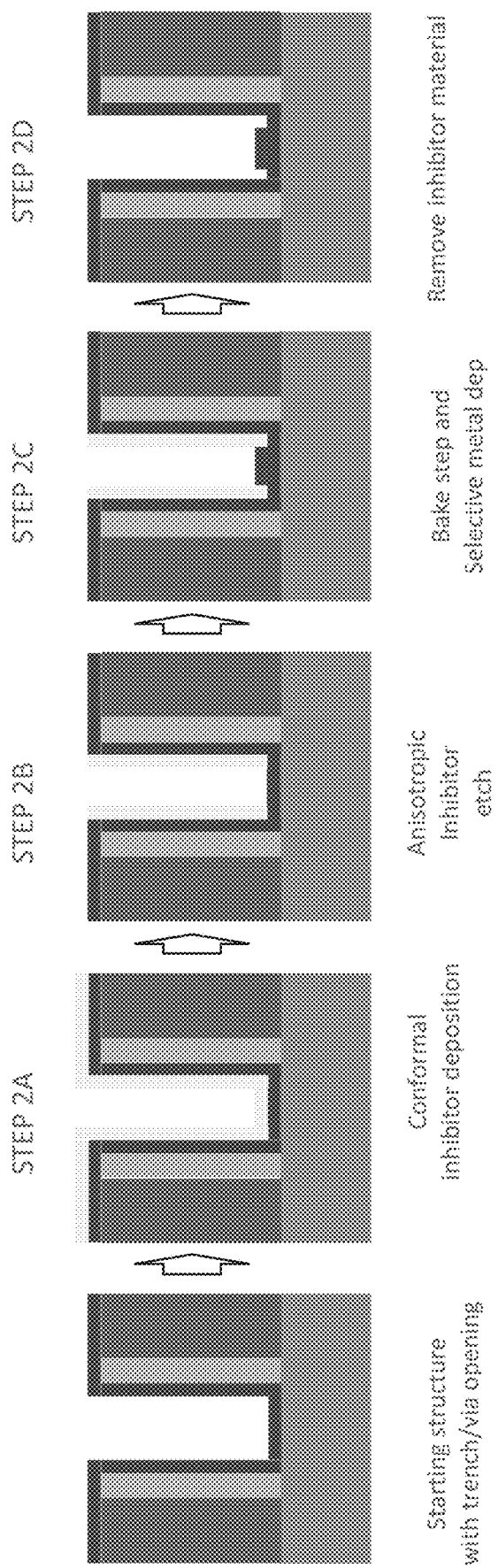
FIG. 14 is a flow diagram illustrating a process flow for selective deposition on a three-dimensional structure such as a trench or via.

An exemplary process for selective deposition on a three-dimensional structure is illustrated in FIG. 14. A structure comprising a trench or via opening is illustrated. As shown in Step 2A, an inhibitor is conformally deposited on the feature. The inhibitor may be deposited as described herein. For example, a polyimide may be vapor deposited as described herein. In Step 2B, the inhibitor is removed from the bottom of the trench by anisotropic etch. As illustrated in Step 2C, following etch the inhibitor is baked and the layer of interest is selectively deposited on the exposed surface at the bottom of the trench relative to the surfaces comprising the inhibitor. Finally, as illustrated in Step 2D, the inhibitor material is removed from the remaining surfaces. Although not illustrated, additional pretreatment steps may be carried out as described herein.

Passivation Blocking Layer

As noted above, a self-assembled monolayer (SAM) can serve to inhibit deposition of an organic passivation layer, thus facilitating selective deposition of the organic passivation layer on other surfaces. The term "blocking" is thus merely a label and need not imply 100% deactivation of the organic passivation layer deposition. As noted elsewhere herein, even imperfect selectivity can suffice to obtain a fully selective structure after an etch back process.

In one embodiment, a passivation blocking layer is formed on the second surface to inhibit deposition of for comprises an SAM containing sulfur. In one embodiment, the second surface is a metallic surface. In one embodiment, the metallic surface is pretreated with acid treatments prior to SAM formation.

Deposition Equipment

Examples of suitable reactors that may be used in the selective deposition processes described herein include commercially available ALD equipment. In addition to ALD reactors, many other kinds of reactors capable of growth of organic passivation layers, including CVD reactors, VDP reactors, and MLD reactors, can be employed.

The selective dielectric on dielectric deposition described herein with respect to FIGS. 1A-1D could be performed in up to five processes. (1) pretreatment, (2) selective organic passivation layer deposition on the first surface; (3) partial etch back, also referred to as a "clean-up" etch, of any organic material from over the second surface, (4) selective dielectric deposition on the second surface; and (5) removal of the organic passivation layer from over the first surface.

In one embodiment, tools for the sequence can be minimized by combining the (2) selective organic passivation layer deposition and the (3) partial etch-back in one chamber, and using a clustered chamber to conduct the (4) selective dielectric deposition on the second surface. The pretreatment can either be performed on another platform (e.g., wet bench) or omitted through tuning of certain recipes. The organic passivation layer removal may be performed in a separate ashing tool, such as those often used for removal of photoresist and other organic materials, or in the deposition chamber using the same or a similar chemistry used for the partial etch back of organic material. Thus, the deposition stages and intervening etch back can be performed in platform that comprises 2 reactors, including either 4 or 8 processing stations, for the polyimide deposition and etch back; and 2 reactors, including either 4 or 8 processing stations, for the selective dielectric deposition.

In some embodiments a cluster tool comprising three or more reaction chambers. For example, a first chamber may be used for one or both of pretreatment and etch processing. A second chamber may be used for deposition of the organic layer, and a third chamber may be used for selective deposition of the film of interest. A bake process may be carried out in situ in the same chamber as the selective deposition of the film of interest, or may be carried out in a different chamber.

In some embodiments, selective deposition processes as described herein can be performed in at least six processes, as illustrated in FIG. 13. (Step 1A) pretreatment, (Step 1B) selective inhibitor deposition, such as deposition of an organic layer deposition on a first surface; (Step 1C) partial etch back, also referred to as a "clean-up" etch, of any organic material from over the second surface, (Step 1D) bake of the organic layer; (Step 1E) selective deposition on the second surface; and (Step 1F) removal of the organic layer from over the first surface.

Figure 5:
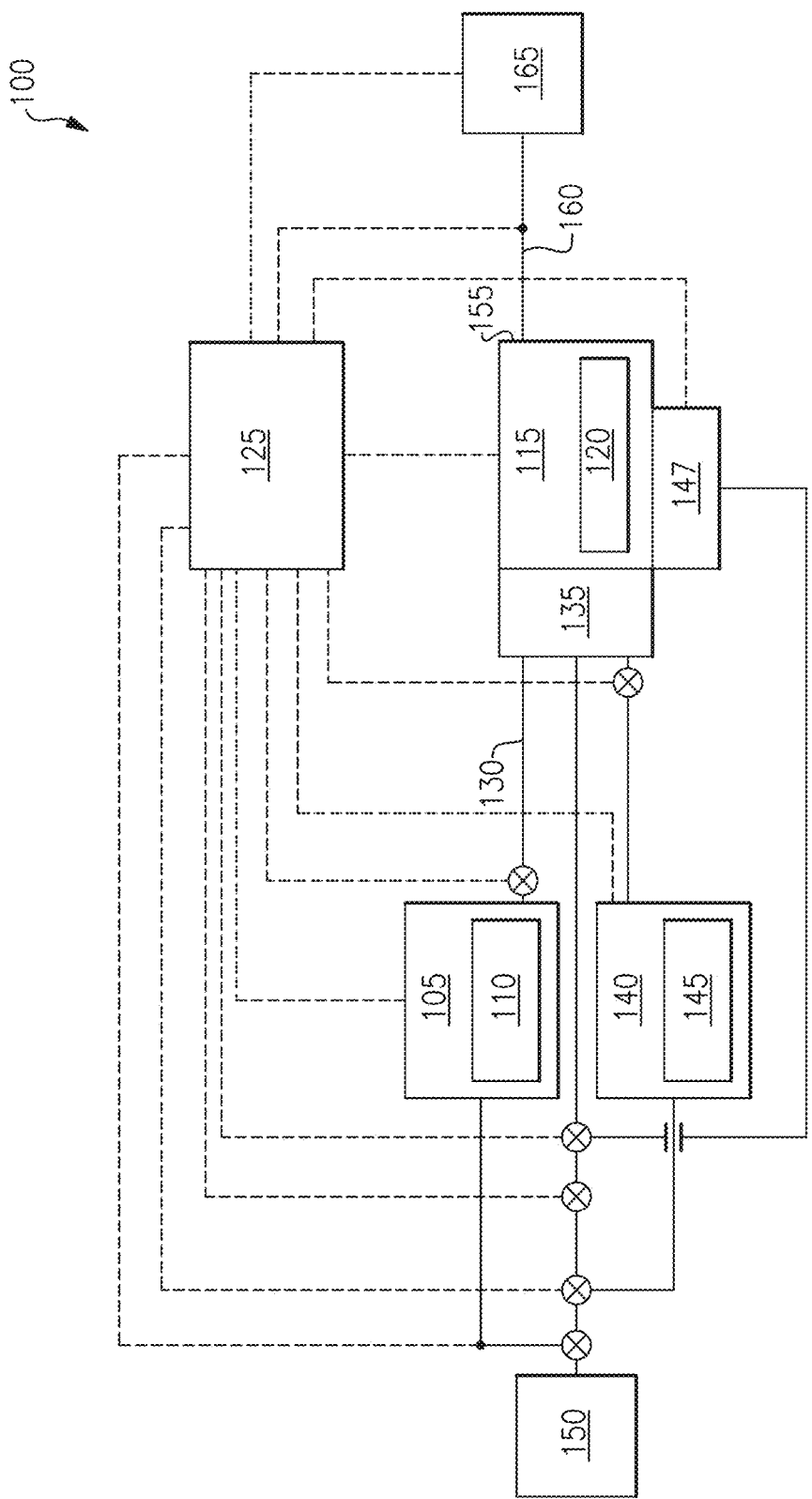
FIG. 5 is a schematic illustration of an apparatus configured for selective deposition of a polymer layer and in situ etch back from undesired surfaces.

Referring to FIG. 5, an apparatus 100 is provided for conducting polymer deposition and organic material etch back in situ. The apparatus 100 includes a reaction chamber defines a reaction space 115 configured to accommodate at least one substrate 120. The apparatus 100 also includes a first reactant vessel 105 configured for vaporizing a first organic reactant 110 to form a first reactant vapor. A gas line 130 fluidly connects the first reactant vessel 105 to a reaction space 115 within which a substrate 120 can be accommodated. The gas line 130 is configured to selectively transport the first reactant vapor from the first reactant vessel 105 to an inlet manifold 135 to the reaction space 115. The apparatus 100 also includes a second reactant vessel 140 holding a second reactant 145. In some embodiments, the second reactant 145 is naturally in a gaseous state; in other embodiments, the second reactant vessel 140 is also configured to vaporize the second reactant 145 from a natural liquid or solid state. The second reactant vessel 140 is in selective fluid communication with the inlet manifold 135. The inlet manifold 135 can include a shared distribution plenum across the chamber width, in a showerhead or cross-flow configuration, or can maintain separate paths to the reaction space 120 for separate reactants. For sequential deposition embodiments, it can be desirable to keep the reactant inlet paths separate until introduction to the reaction space 115 in order to avoid reactions along the surface of common flow paths for multiple reactants, which can lead to particle generation. The apparatus can in some embodiments include additional vessels for supply of additional reactants.

The illustrated apparatus 100 also includes a plasma source 147. Although illustrated schematically as if attached to the reaction space 115, the skilled artisan will appreciate that the plasma source maybe be a remote plasma source external to the reaction space 115, or may be an in situ plasma generator for direct plasma generation (e.g., capacitively coupled) within the reaction space 115. Alternatively or additionally, an ozone generator may be employed for removal of organic material.

One or more additional gas source(s) 150 is (are) in selective fluid communication with the first reactant vessel 105, the reaction space 115 and the plasma source 147 (to the extent separate from the reaction space 115). The gas source(s) 150 can include inert gases that can serve as purge and carrier gases, and other gases (e.g., Ar/$H_2$) for plasma etch back. Inert gas supply from the gas source(s) can also be in selective fluid communication with the second reactant vessel 140, as shown, and any other desired reactant vessels to serve as a carrier gas.

A control system 125 communicates with valves of the gas distribution system in accordance with organic passivation layer deposition and etch back methods and described herein. The control system 125 typically includes at least one processor and a memory programmed for desired processing. For sequential deposition processing, the valves are operated in a manner that alternately and repeatedly exposes the substrate to the reactants, whereas for simultaneous supply of the reactants in a conventional CVD process, the valves can be operated to simultaneously expose the substrate to mutually reactive reactants.

An exhaust outlet 155 from the reaction space 115 communicates through an exhaust line 160 with a vacuum pump 165. The control system 125 is configured to operate the vacuum pump 165 to maintain a desired operational pressure and exhaust excess reactant vapor and byproduct through the exhaust outlet 155.

The control system 125 can also control pressure and temperature in various components of the apparatus 100. For example, the control system can be programmed to keep the substrate 120 at a suitable temperature for the processes being performed. In one embodiment, control system 125 is also configured to maintain the first reactant 110 in the first reactant vessel 105 at a temperature A, and is configured to maintain the substrate 120 in the reaction space 115 at a temperature B, where the temperature B is lower than the temperature A. In an embodiment, the control system 125 or a separate temperature control is also configured to maintain the gas line 130 at a temperature C, where the temperature C is higher than the temperature A.

Accordingly, the apparatus 100 includes source vessels 105, 140 for vaporizing and supplying the reactants described above for polymer deposition (e.g., one vessel for a diamine and one vessel for a dianhydride precursor). The plasma source 147 communicates with gas source(s) 150 that include a source of $H_2$ and inert gas (e.g., noble gas, such as argon or helium). Additionally, the apparatus 100 includes a control system 125 programmed to supply gases and operate the plasma source in a manner to perform the polymer deposition described herein, as well as a hydrogen plasma etch back. The control system 125 maintains the substrate 120 in a range of 180° C. to 220° C., or about 190° C. to 210° C., such that the polymer deposition and etch back can be conducted at the same temperature sequentially, without removing the substrate 120 from the reaction space 115. The etch back may be from 0.5-600 seconds, 1-120 seconds, 1-60 seconds, 1-20 seconds, 2-15 seconds, and 5-15 seconds. As another example, a pulsed ozone ($O_3$) etch process may be used for the etch back process. As the skilled artisan will appreciate, process conditions may be modified for slower and more controlled etching for the purpose of partial etch back to minimize overetching of the desired passivation layer on the first surface. Indeed, etch rate depends strongly upon etch temperature for $O_3$ etching of polymer. Combining the selective deposition of the passivation layer with the partial etch back would not increase process time of the single chamber much, as the etch process is typically very short. The same equipment and etchants can also be used for removal of the passivation layer.

The apparatus 100 configured for polymer deposition and etch back, could be a showerhead reactor with solid source vessels for DAH (with a vaporization temperature of about 40° C.) and PMDA (with vaporization temperature of about 170° C.). In one embodiment, the plasma source 147 comprises an in situ direct plasma (e.g., capacitively coupled) apparatus with argon and $H_2$ supply for the in situ etch back. In another embodiment, the apparatus 100 may be a cross-flow reactor rather than a showerhead reactor, but still having the above-noted with solid source vessels 105, 140 and direct plasma capability. In another embodiment, the plasma source 147 comprises a remote plasma is coupled to the reaction space 115 to supply plasma produces from an $Ar/H_2$ plasma. In another embodiment, the plasma source 147 could be replaced with an ozone generator coupled to the reaction space 115. The remote plasma or ozone generator could, for example, be connected to a showerhead reactor.

The polymer deposition apparatus 100 desirably includes self-cleaning capability to keep the reaction space 115 and exhaust lines 160 clean after multiple depositions. In some embodiments, the in situ or remote $Ar/H_2$ plasma source 147 noted above for etch back can be adapted for periodic chamber cleaning, possibly under higher power or temperatures, as it can operate in the absence of production substrates and only periodically (rather than every wafer). Alternatively, the polymer deposition chamber can be provided with a remote plasma supplied with $NF_3$ etch, or an ozone supply to conduct periodic chamber cleans. In some embodiments, an $O_3/N_2$ supply can be adapted for periodic chamber cleaning, possibly under higher power or temperatures compared to the polymer partial etch back or removal processes, as the chamber clean process operates in the absence of production substrates and only periodically (rather than every wafer).

Line Edge Position

Figure 6:
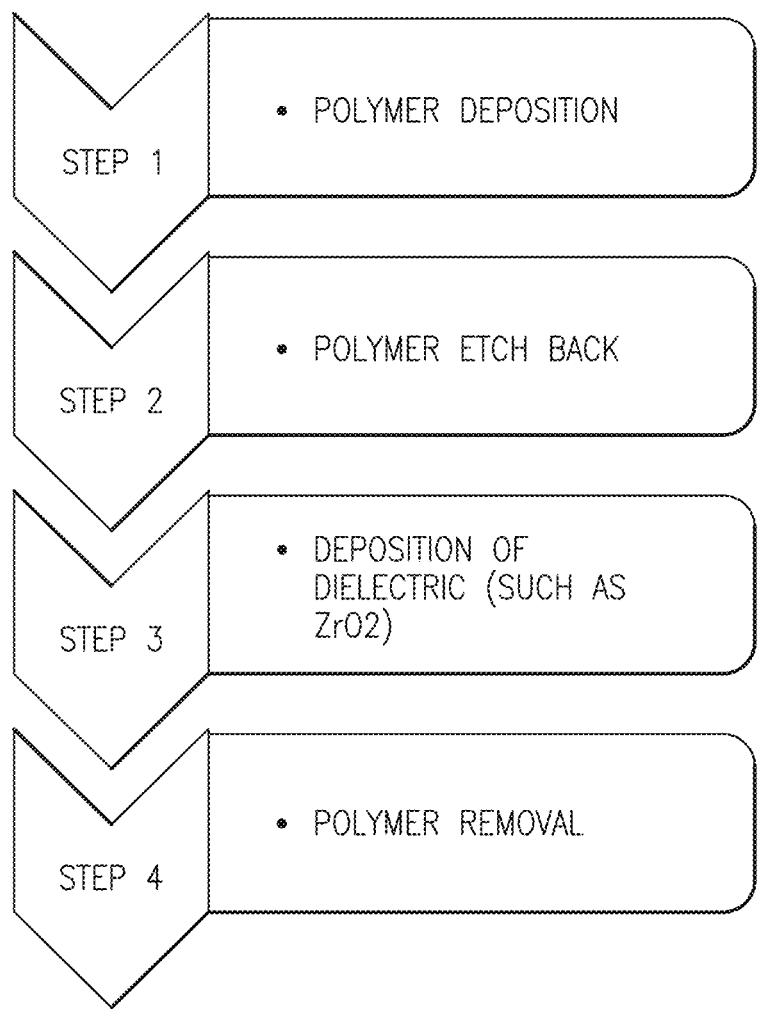
FIG. 6 is a flow diagram generally illustrating processes for selectively depositing a dielectric layer on second surfaces after selective passivation of first surfaces with organic material in accordance with embodiments.

Referring to FIG. 6 and in some embodiments, as described above, selective deposition on a second surface can be accomplished by selective passivation of a first surface following selective deposition of a dielectric, such as $ZrO_2$, on the second surface. In the illustrated flow chart, the first surface can be metallic (e.g, an embedded metal feature in an integrated circuit interlevel dielectric, or ILD), and the second surface can be dielectric (e.g., the ILD). The passivation can comprise a polymer or other organic material selectively deposited on the first surface relative to the second surface of a part in Step 1. Subsequently, a polymer etch back, sometimes referred to as a "clean-up" etch to perfect the selectivity, is performed to remove polymer that may have deposited on the second surface in Step 2, without removing all of the polymer from the first surface. As the polymer acts as a passivation layer, a dielectric material is selectively deposited on the second surface in Step 3. Any number of suitable dielectric materials may be used in Step 3. In some embodiments, the dielectric material may be selected from $ZrO_2$ and other metal oxides, such as transition metal oxides or aluminum oxide, or other dielectric oxides including mixtures having etch selectivity over $SiO_2$-based materials or slow etch rate in conditions in which $SiO_2$-based materials are etched. Even though some such metal oxides may have high k values, higher than 5 or even higher than 10, they are thin, are located in positions that avoid significant parasitic capacitance in metallization structures, and advantageously allow for masking surfaces against selective etching of silicon oxide materials. In other embodiments, the dielectric can be a silicon oxide based material, but may be thicker to serve as an etch mask as described herein. In Step 4 of FIG. 6, the polymer passivation is removed from the first surface.

Figure 7:
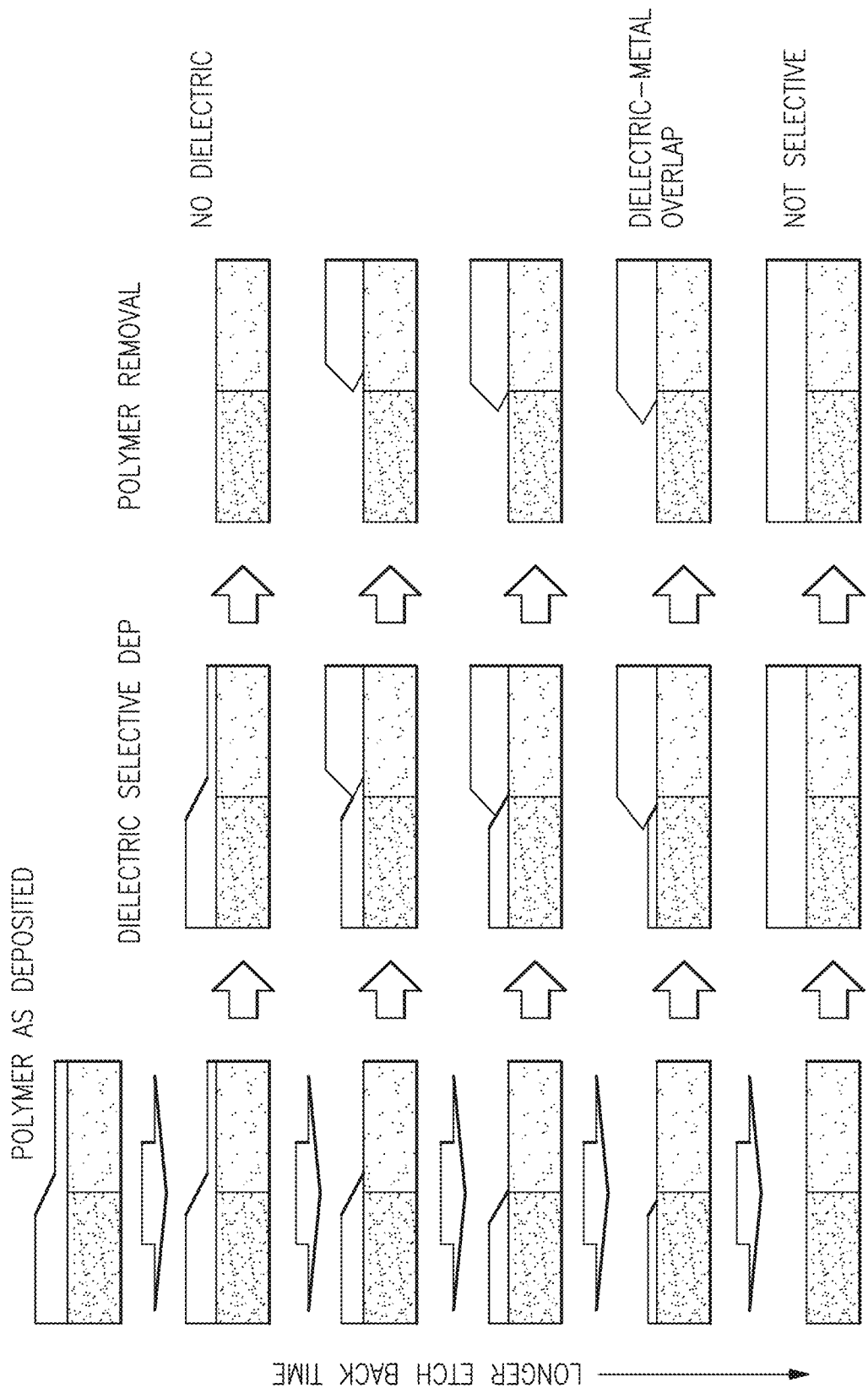
FIG. 7 is a flow diagram utilizing schematic cross sections of a portion of a substrate having first and second surfaces of different compositions, and generally illustrates the effect that the extent of etch back on the passivation material has on the relationship of the dielectric layer formed with the interface of the first and second surfaces.

FIG. 7 illustrates the effect that etch back time for removal of the passivation (e.g., polymer or other organic layer) from the second surface has on the dielectric layer formed. More specifically, the position of the edge of the selectively formed dielectric layer can be controlled relative to the boundary between the underlying metallic and dielectric surfaces by selecting the extent of the intermediate polymer etch back process. In an embodiment, polymer is deposited on the first surface relative to the second surface of a part, as described previously in Step 1 of FIG. 6, as seen in the $1^{st}$ row of illustrations in FIG. 7. As seen in the polymer as deposited illustration, the deposition of the polymer on the first surface creates a thicker polymer layer surface over the first surface, with a relatively thin polymer layer over the second surface, consequently having a downwardly sloped polymer thickness from the first surface to the second surface at the first-second surface boundary. Subsequently, a polymer etch back, as described previously in Step 2 of FIG. 6, may be performed for varying durations (or for the same durations with different etch rates, such as by different temperatures or etchant concentrations, or for different durations and different etch rates) to control the thickness and shape of the polymer layer, as seen in the $2^{nd}$ through $6^{th}$ rows of the first column of illustrations in FIG. 7. The etch back may be isotropic or anisotropic. In some embodiments, a polymer etch time is minimal and the polymer etch does not remove sufficient polymer to expose the second surface, as seen in the $2^{nd}$ row of illustrations in FIG. 7. In this case, the subsequent selective dielectric deposition does not work because both the first and second surfaces are covered with the passivation layer, and even if a small amount of dielectric deposits it will be removed by a lift-off process with removal of the passivation layer. In some embodiments, a polymer etch time is selected to remove the majority of the polymer formed from the second surface, but leave a polymer layer leading edge that extends over the first-second surface boundary onto the second surface, as seen in the $3^{rd}$ row of illustrations in FIG. 7. In this case, subsequent selective deposition of the dielectric and removal of the polymer leaves a gap between the deposited dielectric edge and the first-second surface boundary. In some embodiments, a polymer etch time is selected to remove the polymer from the second surface, and a polymer layer edge is left aligned with the first-second surface boundary. In this case, subsequent selective deposition of the dielectric and removal of the polymer leaves the bottom surface edge of deposited dielectric aligned with the first-second surface boundary. In some embodiments, a polymer etch time is selected to remove the polymer from the second surface and a portion of the polymer from the first surface, and a first gap exists between a polymer layer leading edge and first-second surface boundary, as seen in the $5^{th}$ row of illustrations in FIG. 7. In this case, subsequent selective deposition of the dielectric and removal of the polymer leaves the deposited dielectric extending over the first-second surface boundary and overlapping with the first surface. If the polymer etch time is performed for an extended period of time and the polymer etch completely removes the polymer from both the first surface and the second surface, as seen in the $6^{th}$ row of illustrations in FIG. 7, then subsequent dielectric deposition is not selective.

Thus, selective dielectric selective deposition and partial polymer etch back, as described previously in Steps 3 and 4 of FIG. 6, may be performed to create various relationships between the edge of the selectively deposited dielectric layer on the second surface and the interface between the first and second surfaces, depending on the extent of the passivation etch back following its selective deposition, as seen in the right-most images of the $2^{nd}$ through $6^{th}$ rows of the third column of illustrations in FIG. 6. In some embodiments, no dielectric layer is formed because the polymer layer passivated the second surface, as seen in the $2^{nd}$ row of illustrations in FIG. 7. In some embodiments, a gap exists between a dielectric on the second surface first surface, as seen in the $3^{nd}$ row of illustrations in FIG. 7. In some embodiments, the dielectric layer edge is aligned with the first-second surface boundary, as seen in the $4^{th}$ row of illustrations in FIG. 7. In some embodiments, the dielectric layer overlaps the first surface, as seen in the $5^{th}$ row of illustrations in FIG. 7. In some arrangements, the dielectric layer forms on both the first surface and the second surface because no polymer layer passivated the first surface.

Figure 8:
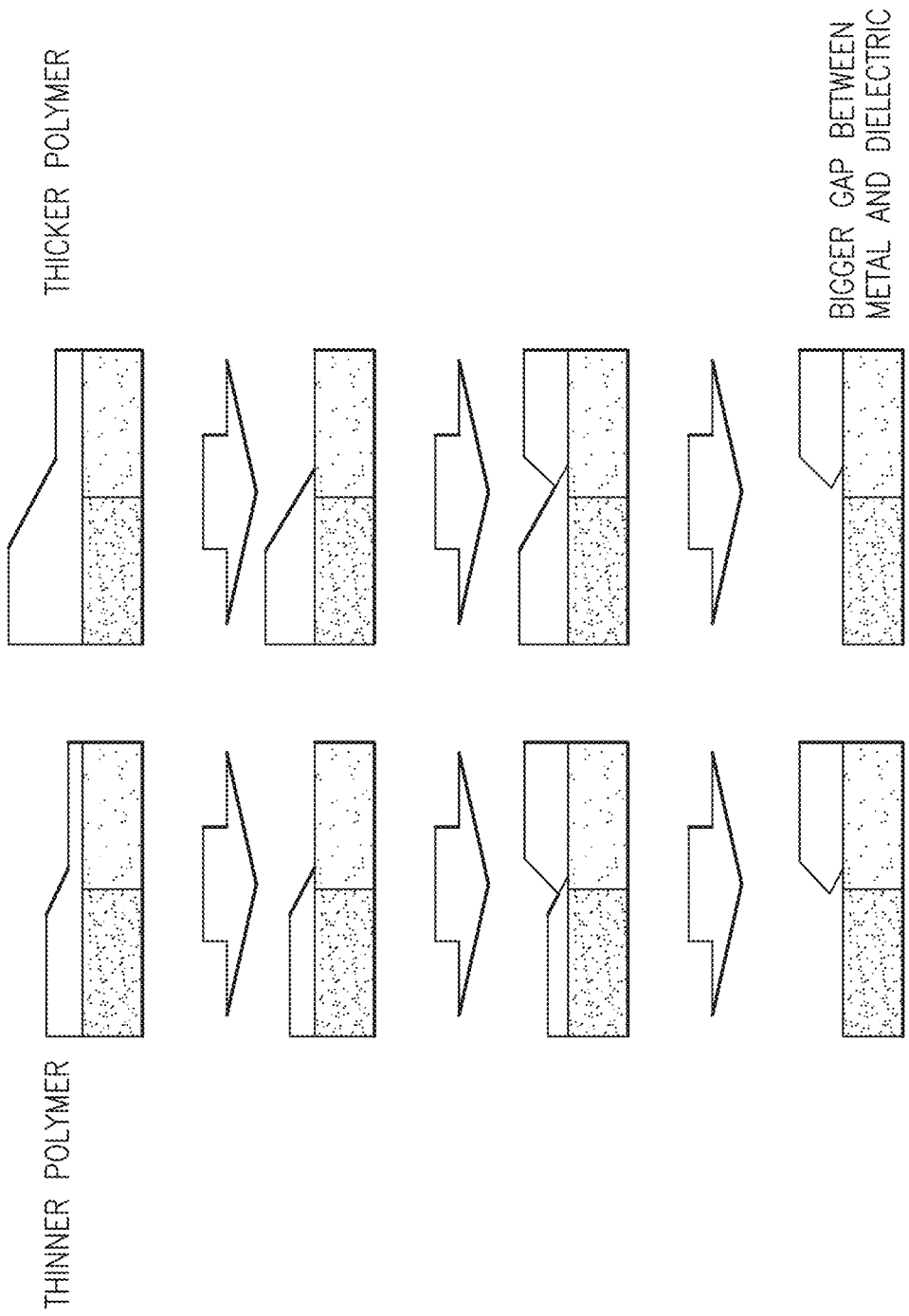
FIG. 8 is a flow diagram utilizing schematic cross sections of a portion of a substrate having first and second surfaces of different compositions, and generally illustrates the effect passivation layer thickness has on the relationship of the dielectric layer formed with the interface of the first and second surfaces.

FIG. 8 illustrates the effect that passivation layer deposition thickness has on the dielectric layer formed. More specifically, the position of the edge of the selectively formed dielectric layer can be controlled relative to the boundary between the underlying metallic and dielectric surfaces by selecting the thickness of the intermediate polymer passivation layer. As passivation layer deposition thickness increases, the passivation layer thicknesses on both the first surface and second surface are increased. However, because the passivation layer is selectively deposited on the first surface, the passivation thickness over the second surface increases less than the passivation layer thickness over the first surface. Therefore, a passivation etch back, dielectric deposition and passivation removal will create selective dielectric layers with varying positions relative to the first-second surface boundary. In some embodiments, a passivation layer is deposited which produces a gap between a selectively deposited dielectric layer edge and the first-second surface boundary, as seen in as seen in the $1^{st}$ column of illustrations in FIG. 8. In some embodiments, a thicker polymer layer is deposited which produces a larger gap between a selectively deposited dielectric layer edge and the first surface, as seen in as seen in the $2^{nd}$ column of illustrations in FIG. 8.

Figure 9:
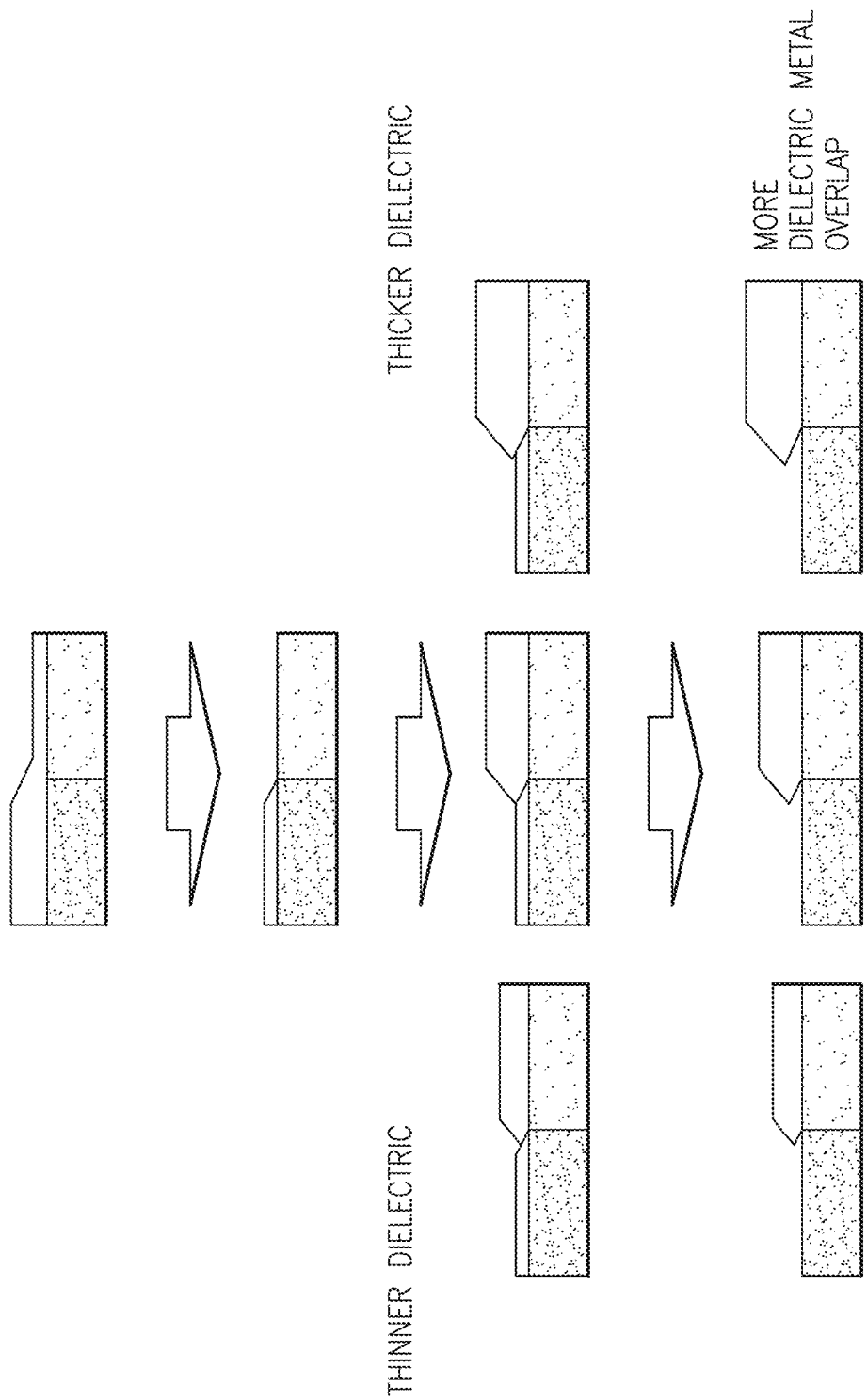
FIG. 9 is a flow diagram utilizing schematic cross sections of a portion of a substrate having first and second surfaces of different compositions, and generally illustrates the effect dielectric thickness has on the relationship of the dielectric layer formed with the interface of the first and second surfaces.

FIG. 9 illustrates the effect selectively deposited dielectric thickness has on the relative positions of the dielectric layer formed and the first-second surface boundary. More specifically, the position of the edge of the selectively formed dielectric layer can be controlled relative to the boundary between the underlying metallic and dielectric surfaces by selecting the thickness of the selective dielectric layer. As dielectric deposition thickness selectively deposited on the second surface increases, the dielectric overhang edge increasingly extends further past the first-second surface boundary. In some embodiments, a dielectric layer is deposited which produces a certain overhang structure, as seen in as seen in the $1^{st}$ column of illustrations in FIG. 9. In some embodiments, a thicker dielectric layer is deposited which produces a greater overhang, as seen in as seen in the $2^{nd}$ column of illustrations in FIG. 9. In some embodiments, an even thicker dielectric layer is deposited which produces an even greater dielectric overhang over the first surface, as seen in as seen in the $3^{rd}$ column of illustrations in FIG. 9. For certain subsequent processes, such as anisotropic processing (e.g., anisotropic reactive ion etching), the extent of the overhang can shadow portions of the first surface and protect against the subsequent processing.

Thus, in some embodiments, though largely selectively formed over the dielectric surface similar to FIG. 1D, the dielectric layer is selectively deposited to produce an overhang and/or overlap with the metallic feature. In some embodiments, the dielectric layer does not comprise an overhang or overlap, and the edge of the selectively deposited dielectric on dielectric can be aligned with the edge of the metallic feature or there can be a gap between the edge of the selectively deposited dielectric layer and the metallic feature. Because of the selective deposition techniques taught herein, the selectively deposited dielectric layer may have features characteristic of selective deposition, without the use of traditional masking and etching to pattern the dielectric layer. For example, the edge of the dielectric layer may be tapered with a slope of less than 45 degrees, rather than having a vertical or steeply sloped sidewall, as is typical of photolithographically patterned layers. This characteristic etch profile may remain whether or not the selectively deposited layer was subjected to a clean-up etch, or partial etch back.

Figure 10A:
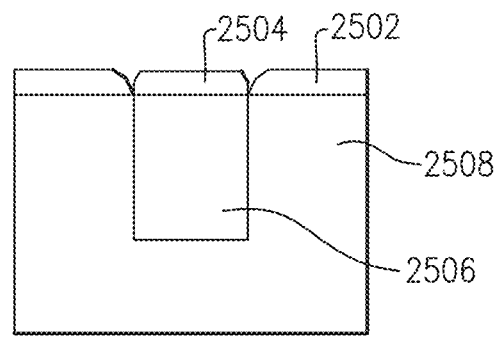
FIG. 10A is a schematic cross section of a portion of substrate having flush first and second surfaces of different compositions with passivation and dielectric layers selectively deposited thereover, respectively.

FIGS. 10A-10D illustrate how topography can affect the relationship between a selectively deposited dielectric and the boundary between first and second surfaces FIG. 10A illustrates a planar structure that results in an edge of a selectively deposited dielectric 2502 being aligned with the first-second surface boundary. The first surface that is passivated by a passivation layer 2504, for example a polymer material, can be defined by a metallic material, such as embedded metal 2506, and the second surface can be defined by a low k dielectric, such as an interlevel dielectric (ILD) 2508. The passivation layer 2504 is selectively deposited over the first surface and the dielectric layer 2502 is selectively deposited over the second surface, wherein the edge of the dielectric layer 2502 is aligned with the first-second surface boundary.

Figure 10B:
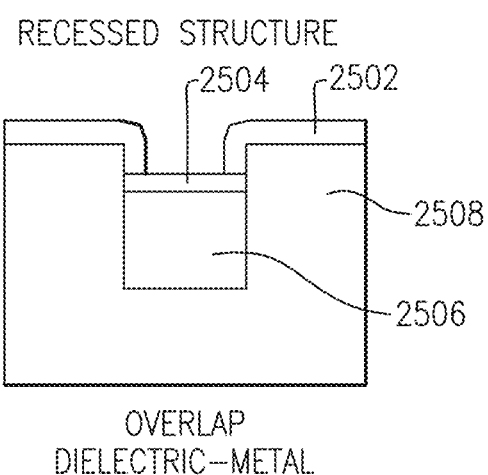
FIG. 10B is a schematic cross section of a portion of substrate having first and second surfaces of different compositions with the first surfaces recessed relative to the second surfaces and passivation and dielectric layers selectively deposited thereover, respectively.

FIG. 10B illustrates a recessed first surface relative to the second surface. As above, the first surface can comprise a metallic material 2506 embedded and recessed with in a low k dielectric material 2508 that defines the second surface.

The passivation layer 2504 is selectively formed over the first surface within the recess. The dielectric layer 2502 is disposed over the second surface and over the recess walls, wherein the edge of the dielectric layer 2502 meets the surface of the passivation layer 2504. Removal of the passivation layer 2504 will result in the dielectric layer 2502 selectively formed on the second surface but overlapping with the first surface (e.g., metallic feature 2506).

Figure 10C:
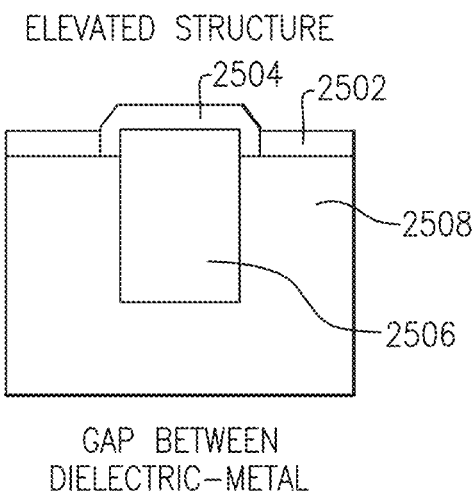
FIG. 10C is a schematic cross section of a portion of substrate having first and second surfaces of different compositions with first surfaces elevated relative to the second surfaces and with passivation and dielectric layers selectively deposited thereover, respectively.

FIG. 10C illustrates an elevated first surface with respect to the second surface. The first surface can be defined by a metallic material 2506 embedded in and protruding above the second surface, which can be a low k dielectric material 2508. The passivation layer 2504 is disposed over the first surface, including protruding side walls, and thus at least partially disposed over the second surface. The dielectric layer 2502 is disposed over the second surface but is spaced from the first surface by the thickness of the passivation material 2504 on the side walls. Thus, after removal of the passivation layer 2504, there is a gap between the dielectric layer 2502 and the first surface (e.g., protruding metallic feature 2606)

Figure 10D:
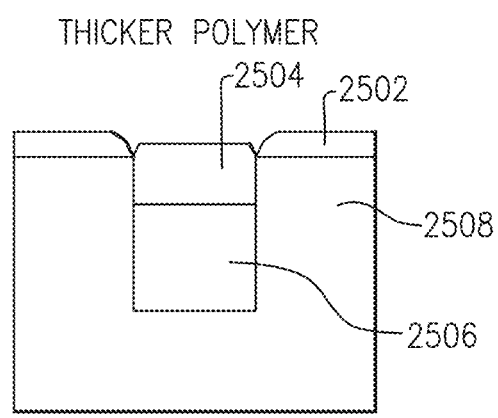
FIG. 10D is a schematic cross section of a portion of substrate having first and second surfaces of different compositions with first surfaces recessed relative to the second surfaces and with passivation and dielectric layers selectively deposited thereover, respectively.

FIG. 10D illustrates a recessed first surface of some embodiments. In this case, after removal of the passivation layer 2504, a gap is left between the selectively deposited dielectric layer 2502 on the second surface and the first surface. In this case, the gap takes the form of a vertical sidewall of the second surface, which is then exposed to subsequent processing.

Thus, FIGS. 7-10D illustrate variables that can be adjusted to tune the position of a selectively deposited dielectric 2502 (e.g., on dielectric second surface) relative to an interface between the first and second surfaces (e.g., between a metallic feature 2506 and low k dielectric 2508). In particular, FIG. 7 shows how extent or time for passivation layer etch back can affect the relative positions; FIG. 8 shows how thickness of the selectively deposited passivation layer can affect the relative positions; FIG. 9 shows how thickness of the selectively deposited dielectric layer can affect the relative positions; and FIGS. 10A-10D show how topography of the first and second surfaces can affect the relative positions. These variables can thus be adjusted to affect whether the selectively deposited dielectric on the second surface is aligned with, has a gap relative to, or overlaps the first surface.

Example Applications

Figure 11A:
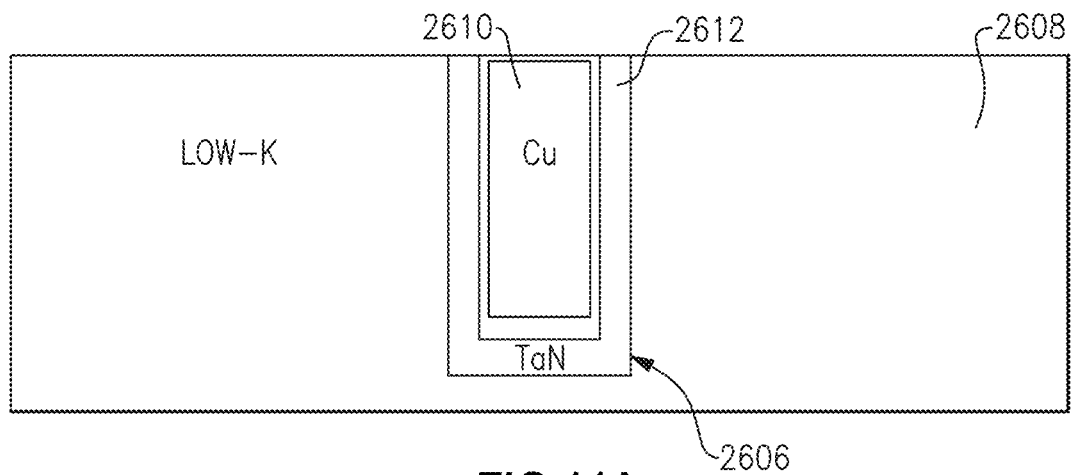
FIG. 11A is a schematic cross section of a portion of a substrate with an embedded metal feature.

FIGS. 11A-11E illustrate a device and process of creating a device, in some embodiments, with improved electrical isolation. FIG. 11A illustrates a partially fabricated integrated circuit with an embedded metallic feature 2606 that defines a first surface which is flush with a second surface, defined by the surrounding low k material 2608, similar to the planar structure shown in FIG. 10A. The metallic feature comprises a first material further comprising Cu 2610 and TaN barrier material 2612 positioned within a first low-k dielectric material 2608.

Figure 11B:
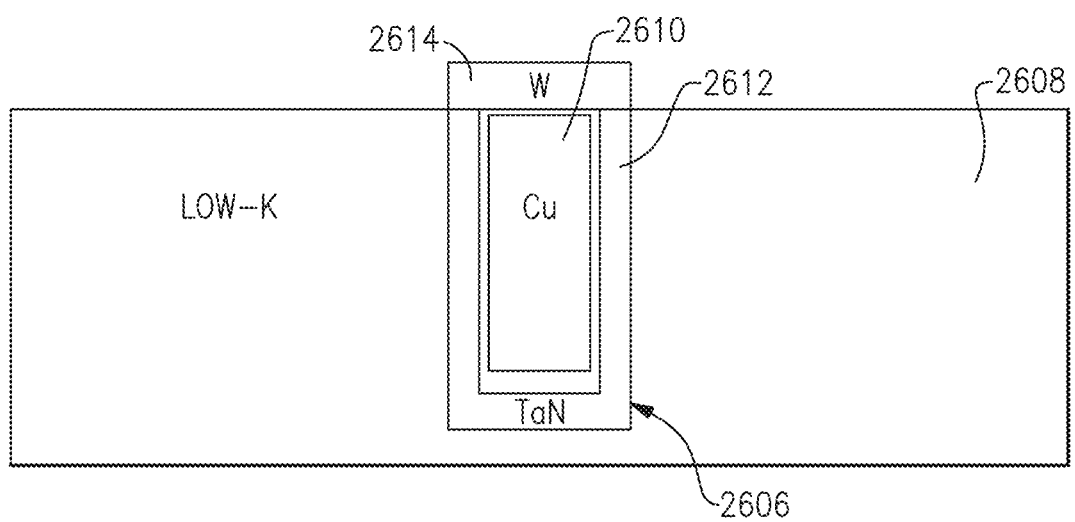
FIG. 11B is a schematic cross section of the substrate of FIG. 11A after formation of a metal cap to define a first surface.

FIG. 11B illustrates the device of FIG. 11A subsequent to a conductive barrier layer 2614 over the first material. In some embodiments, the barrier layer 2614 may be W. While illustrated as protruding, in some embodiments the barrier material 2614 over the Cu 2610 line or via may be embedded in and flush with the surrounding low k material 2608.

Figure 11C:
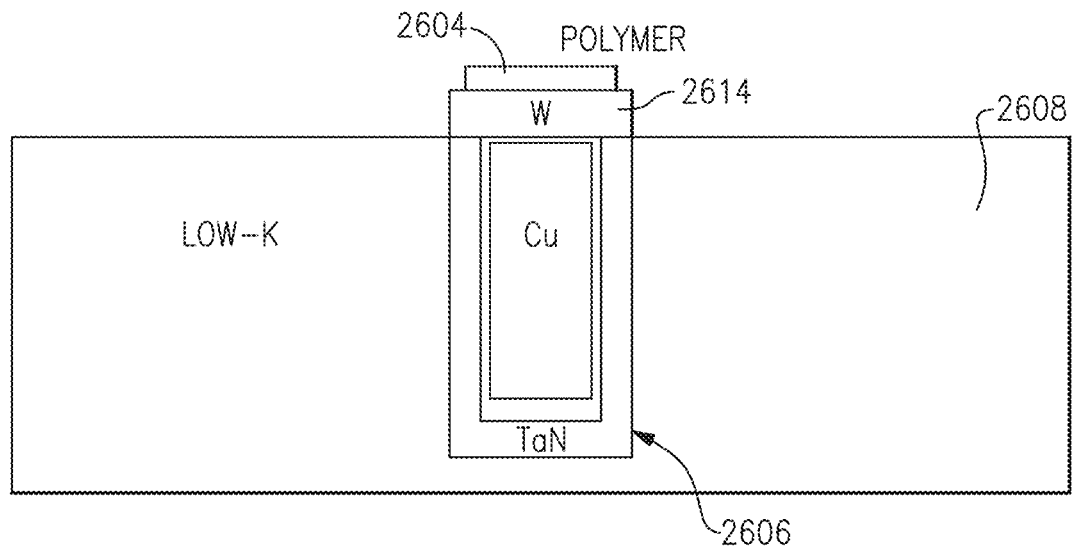
FIG. 11C is a schematic cross section of the substrate of FIG. 11B after selective passivation deposition and etch back, leaving a passivation film over the metal cap with edges of the metal cap exposed.

FIG. 11C illustrates the device of FIG. 11B subsequent to the selective deposition of a passivation layer 2604 over the first surface now defined by the metallic barrier layer 2614 (W), wherein edges of the first surface are exposed. In some embodiments, the passivation layer 2604 may be an organic material, such as a polymer. In some embodiments, the selective deposition of the passivation layer 2604 is followed by an etch back of the passivation layer material sufficient to expose some of the metallic first surface.

Figure 11D:
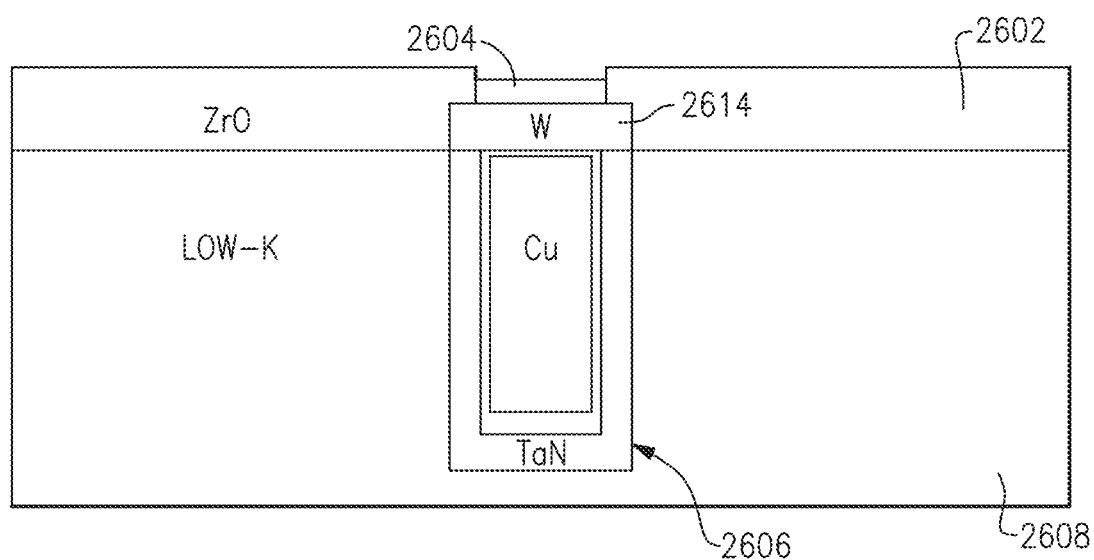
FIG. 11D is a schematic cross section of the substrate of FIG. 11C after selective deposition of a dielectric material over low k surfaces of the substrate, where the deposited dielectric resists etching of low k materials and overlaps with the metal cap.

FIG. 11D illustrates the device of FIG. 11C subsequent to the selective deposition of a dielectric layer 2602 over the second surface, overlapping with the metallic first surface. In some embodiments, the dielectric layer 2602 may be a high-k material. In some embodiments, the high-k material may be $ZrO_2$. In some embodiments, the selective dielectric layer 2602 may be a low-k material, such as SiOC, $Al_2O_3$, and SiN. In some embodiments, the selectively deposited dielectric material 2602 may serve as an etch stop with respect to subsequent etches through low k material 2608 to open trenches or vias that expose the metallic barrier material 2614.

Figure 11E:
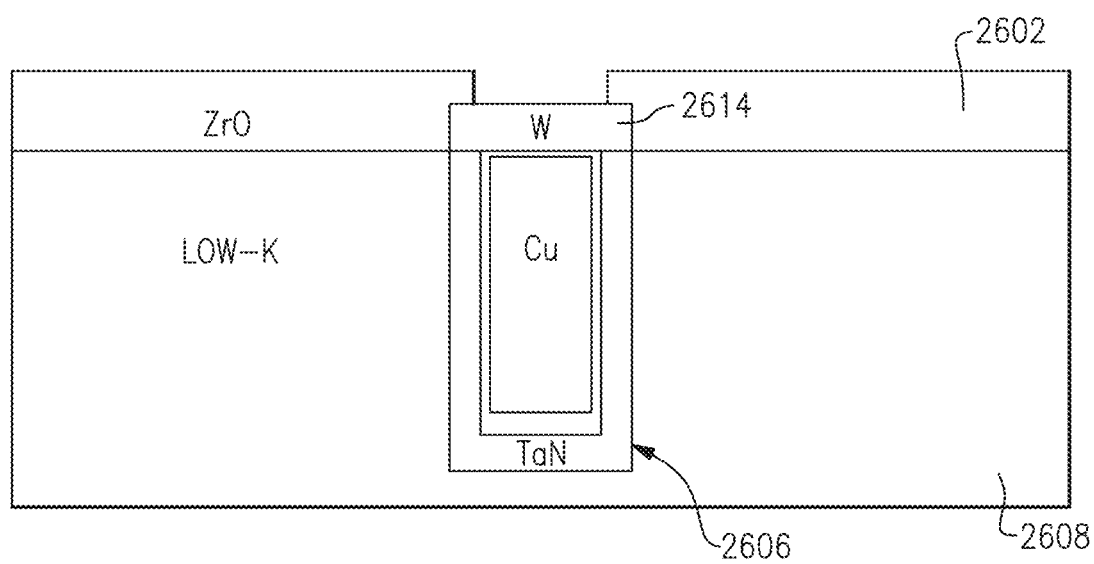
FIG. 11E is a schematic cross section of the substrate of FIG. 11D after removal of the passivation layer.

FIG. 11E illustrates the device of FIG. 11D subsequent to removal of the polymer passivation layer 2604, thereby exposing the underlying metal layer surface (of barrier material 2614 in this case). The selective dielectric 2602 overlaps the metallic first surface defined by barrier layer 2614 and reduces the risk of shorting when a subsequent metallic feature (e.g., overlying metal line or via) is formed thereover. In particular, a low k material is deposited over the structure of FIG. 11E, and openings are created and filled with metal. The openings are created by masking and selective low k etching, and the etch stops on the selectively deposited dielectric (e.g., $ZrO_2$). The overlap of the selectively deposited dielectric 2602 with the metallic feature defined by the barrier layer 2614, resulting from the selection of conditions during the passivation, etch-back, dielectric deposition and/or topography, protects against misalignment. Thus the overlap prevents contact with adjacent metallic features or undesired etching of the lower low k material 2608. Note that the selectively deposited dielectric material 2602 can stay in the final integrated circuit device, having served as an etch stop between ILD layers. Although ordinarily high k materials are avoided in metallization processes, parasitic capacitance is minimal. Minimal parasitic capacitance is due to the predominant position of the high k material over the low k material, the thinness of the high k material due to its functions, and the advantage of high selectivity for this dielectric capping layer over high k material outweighs slight parasitic capacitance introduced by the material selection. Of course, high etch selectivity may also be achieved with lower k materials to be selectively deposited on the ILD.

Figure 12A:
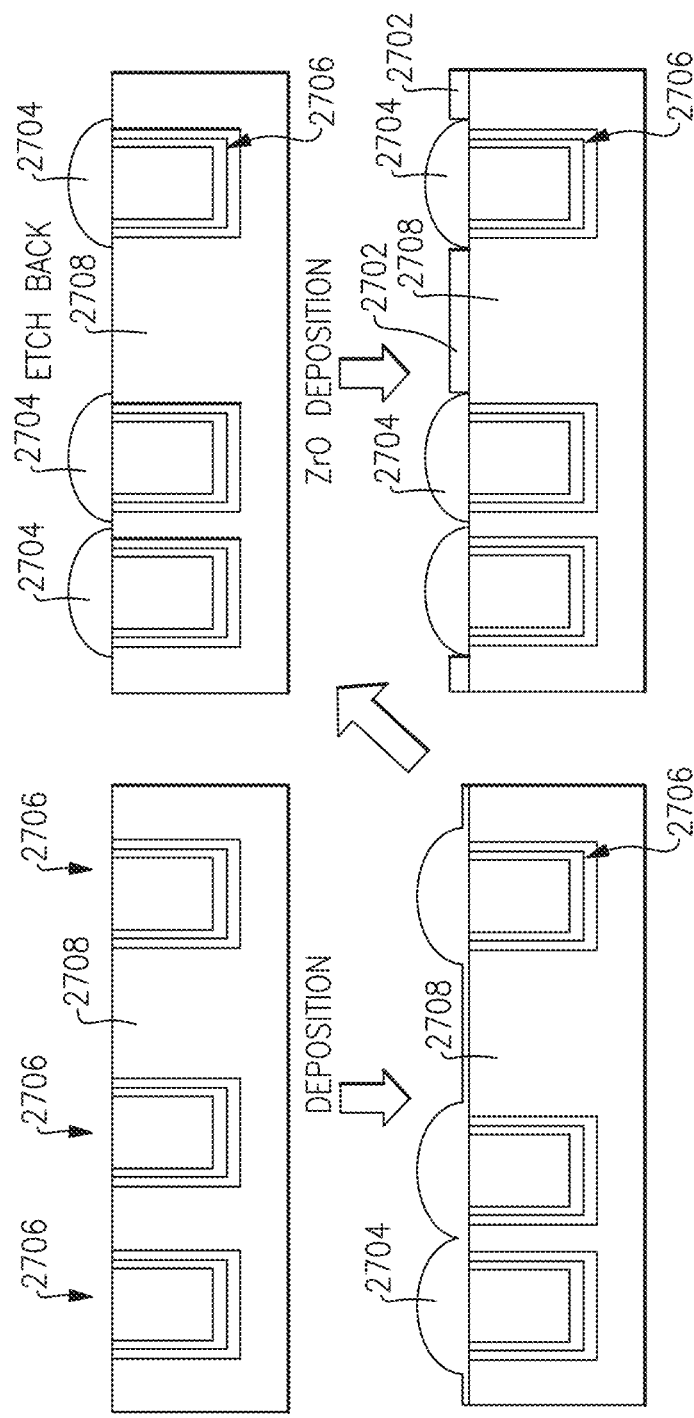
FIG. 12A is a flow diagram showing schematic cross sections of a portion of a substrate having first and second surfaces of different compositions, and generally illustrates selective passivation of the first surfaces, etch back in a manner that leaves the passivation overlapping with the second surfaces, and selective deposition of a dielectric etch mask on the remainder of the second surfaces.
Figure 12B:
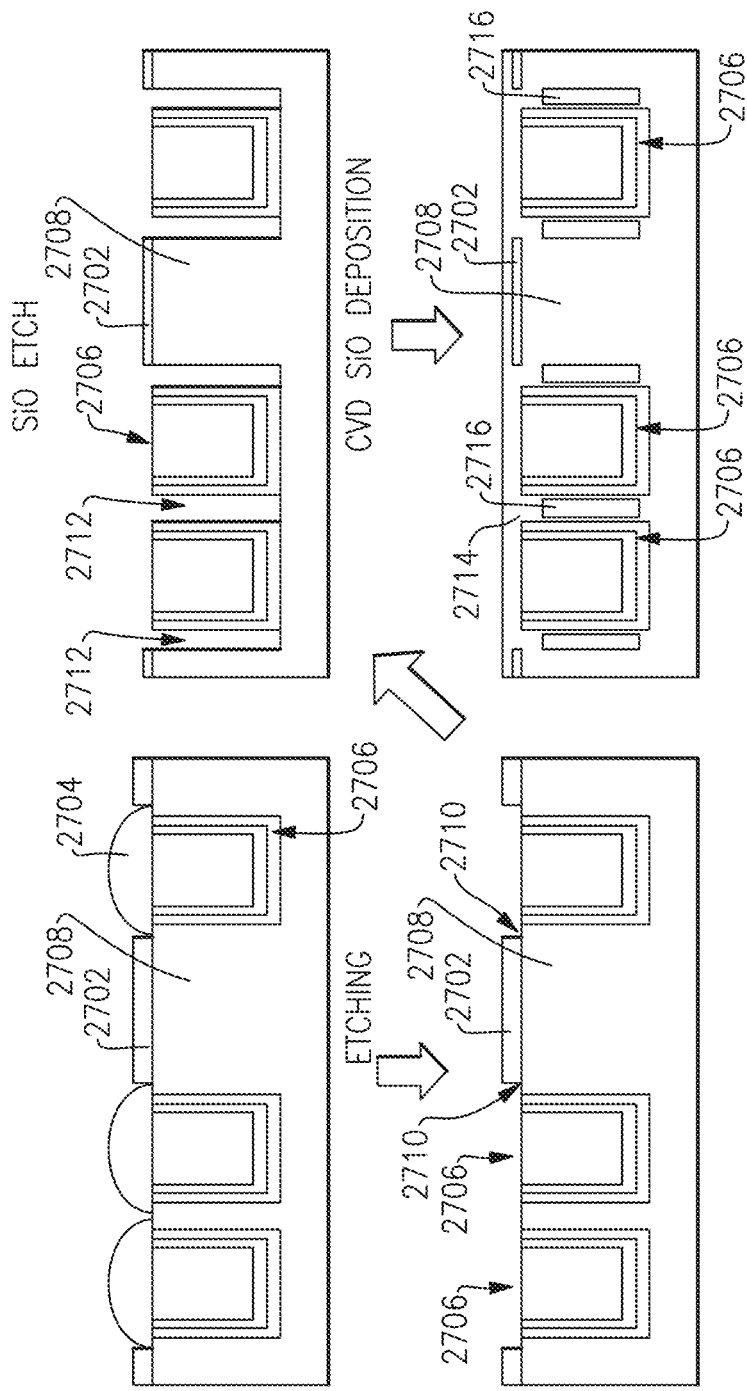
FIG. 12B are schematic cross sections of the substrate of FIG. 12A, following removal of the passivation layers, leaving gaps between the first surfaces and the dielectric etch mask, selective etching of the low k material exposed in the gaps, and deposition to leave air-gaps within the substrate.

FIGS. 12A-12B illustrate a device and process of creating a device, in some embodiments, with air-gaps, which may be desirable for a variety of reasons, such as reduction of parasitic capacitance between closely spaced metallic features (e.g., metal lines) in an integrated circuit. FIG. 12A illustrates planar surface of a partially fabricated integrated circuit of some embodiments, similar to the device previously shown in FIG. 10A. The initial structure may be a first surface defined by a metallic feature 2706 (e.g., Cu line with dielectric and barrier liners) surrounded by a second surface defined by dielectric material 2608 (e.g., low k ILD). A passivation layer 2704 is selectively deposited over the first surface, and an etch back performed to expose the second surface in a manner that leaves the passivation layer 2704 over the first surface and partially over the second surface. A dielectric 2702 is selectively deposited over the second surface, wherein the dielectric layer edge is spaced away from the first-second surface boundary onto the second surface. FIG. 12B illustrates the device of FIG. 12A subsequent to the removal of the passivation layer 2704 to expose the first surface and partially expose the second surface previously covered by the first material, leaving a gap 2710 between the selectively deposited dielectric material and the first surface (metallic feature 2706). Subsequently selectively etching the exposed second material forms cavities 2712 in those gaps 2710 next to the metallic features. In some embodiments, the second material that is selectively etched is SiO. In some embodiments, selective etching is an HBr dry etch. An HBr dry etch can selectively etch silicon oxide at about 6-8 nm/min, whereas certain other materials are etched at lower rates such as silicon nitride (<0.3 nm/min) and zirconium oxide (<0.3 nm/min), and likely will not etch tungsten without chlorine (e.g., $Cl_2$) or sulfur hexafluoride (e.g., $SF_6$). Deposition of a third material 2714, such as standard low k material, with sufficiently low conformality leaves air-gaps 2716 within the low k material 2708 adjacent to a lateral sides of the metallic features 2706. As is known in the art, the air cavities lower the overall k value of the ILD and reduce parasitic capacitance between metallic features.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of selective deposition on a second surface of a substrate relative to a first surface of the substrate, where the first and second surfaces have different compositions, the method comprising, in order:
   treating the first and second surfaces by exposing the substrate to a silane;
   selectively forming an inhibitor layer comprising a polymer from vapor phase reactants on the first surface relative to the second surface;
   baking the inhibitor layer, wherein baking comprising heating the substrate to a temperature of about 200 to about 500° C.; and
   selectively depositing a layer of material from vapor phase reactants on the second surface relative to the inhibitor layer.

2. The method of claim 1, wherein the silane comprises an alkylaminosilane.

3. The method of claim 2, wherein treating comprises exposing the substrate to N-(trimethylsilyl)dimethylamine (TMSDMA) or trimethylchlorosilane.

4. The method of 1, additionally comprising cleaning the second surface to remove any inhibitor after selectively forming the inhibitor layer.

5. The method of claim 4, wherein cleaning comprises treatment with hydrogen plasma.

6. The method of claim 1, wherein baking comprises heating the substrate to a temperature of from about 300 to 400° C.

7. The method of claim 1, additionally comprising cleaning the first and second surfaces after selectively depositing the layer of material.

8. The method of claim 7, wherein cleaning comprises treating the surfaces with hydrogen plasma.

9. The method of claim 1, wherein selectively forming an inhibitor layer comprises selectively vapor depositing an organic polymer layer on the first surface.

10. The method of claim 9, wherein the organic polymer layer is a polyimide layer.

11. The method of claim 1, wherein the layer of material is selectively deposited by an atomic layer deposition process.

12. The method of claim 1, wherein the first surface comprises a metal or metallic material and the second surface comprises a dielectric material.

13. The method of claim 1, wherein the layer of material that is selectively deposited on the second surface relative to the inhibitor layer comprises a metal oxide.

14. The method of claim 13, wherein the metal oxide comprises zirconium oxide, hafnium oxide, aluminum oxide, titanium oxide, tantalum oxide, yttrium oxide, lanthanum oxide, or other transition metal oxide or mixtures thereof.

15. The method of claim 13, wherein the metal oxide comprises a dielectric transition metal oxide.

16. The method of claim 13, wherein the metal oxide comprises aluminum oxide.

17. The method of claim 16, wherein the aluminum oxide is deposited using an aluminum precursor comprising trimethyl aluminum (TMA), dimethylaluminumchloride, aluminum trichloride ($AlCl_3$), dimethylaluminum isopropoxide (DMAI) or triethyl aluminum (TEA).

18. The method of claim 16, wherein the aluminum oxide is deposited using an aluminum precursor comprising a heteroleptic aluminum compound comprising an alkyl group and another ligand, such as a halide, for example Cl.

19. The method of claim 16, wherein the aluminum oxide is deposited using an aluminum precursor comprising an aluminum alkyl compound comprising two different alkyl groups as ligands.

20. The method of claim 16, wherein the aluminum compound is deposited using an aluminum precursor comprising a metalorganic aluminum compound or an organometallic aluminum compound.

21. The method of claim 1, wherein the layer of matrerial comprises a metal nitride.

22. The method of claim 21, wherein the metal nitride is titanium nitride.

23. The method of claim 22, wherein the titanium nitride is deposited by a vapor deposition process from $TiCl_4$ and $NH_3$.

* * * * *

UNITED STATES PATENT AND TRADEMARK OFFICE
CERTIFICATE OF CORRECTION

PATENT NO. : 11,145,506 B2
APPLICATION NO. : 16/588600
DATED : October 12, 2021
INVENTOR(S) : Jan Willem Hub Maes Page 1 of 2

It is certified that error appears in the above-identified patent and that said Letters Patent is hereby corrected as shown below:

On the Title Page

In Column 1, item (72), Inventors, Line 3, delete "VamsI" and insert --Vamsi--.

On page 4, in Column 1, item (56), Other Publications, Line 15, delete "H20" and insert --H2O--.

On page 5, in Column 1, item (56), Other Publications, Line 10, delete "Dieletrics:" and insert --Dielectrics:--.

On page 5, in Column 1, item (56), Other Publications, Line 35, delete "octadecanethlol" and insert --octadecanethiol--.

On page 5, in Column 1, item (56), Other Publications, Line 39, delete "Layor" and insert --Layer--.

On page 5, in Column 1, item (56), Other Publications, Line 43, delete "opitimization" and insert --optimization--.

On page 5, in Column 2, item (56), Other Publications, Line 11, delete "Prag." and insert --Prog.--.

In the Specification

In Column 6, Line 58, delete "terminations" and insert --terminations.--.

In Column 8, Line 20, delete "surface" and insert --surface.--.

In Column 9, Line 1, delete "$R^I$" and insert --$R^{III}$--.

In Column 13, Line 59, delete "(e.g," and insert --(e.g.,--.

In Column 17, Line 40, delete "above" and insert --above.--.

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,145,506 B2

In Column 30, Line 7, delete "(e.g," and insert --(e.g.,--.

In Column 31, Line 42, delete "3$^{nd}$" and insert --3$^{rd}$--.

In Column 32, Line 51, delete "surfaces" and insert --surfaces.--.

In Column 33, Line 21, delete "2606)" and insert --2606).--.

In Column 35, Line 15, delete "C1$_2$" and insert --Cl$_2$--.

In the Claims

In Column 35, Line 51, Claim 4, after "of" insert --claim--.

In Column 36, Line 48, Claim 21, delete "matrerial" and insert --material--.